(12) United States Patent
Chamas et al.

(10) Patent No.: US 12,706,623 B2
(45) Date of Patent: Aug. 11, 2026

(54) WIRELESS TRANSMITTER WITH BIAS CONTROL

(71) Applicant: QUALCOMM Incorporated, San Diego, CA (US)

(72) Inventors: Ibrahim Ramez Chamas, Carlsbad, CA (US); Hayg-Taniel Dabag, San Diego, CA (US); Asad Ali Nawaz, San Diego, CA (US); Huan Wang, Lake Forest, CA (US); Waqas Ahmad, San Diego, CA (US); Bhushan Shanti Asuri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 339 days.

(21) Appl. No.: 18/521,108

(22) Filed: Nov. 28, 2023

(65) Prior Publication Data

US 2024/0283473 A1 Aug. 22, 2024

Related U.S. Application Data

(60) Provisional application No. 63/485,996, filed on Feb. 20, 2023.

(51) Int. Cl.

| | |
|---|---|
| ***H04B 1/04*** | (2006.01) |
| ***H03F 3/24*** | (2006.01) |
| ***H04B 1/30*** | (2006.01) |

(52) U.S. Cl.
CPC ............ *H04B 1/0475* (2013.01); *H03F 3/24* (2013.01); *H04B 1/30* (2013.01)

(58) Field of Classification Search
CPC ....... H03K 19/0175; H03K 19/017509; H03K 19/017545; H03F 3/20; H03F 3/24;
(Continued)

(56) References Cited

U.S. PATENT DOCUMENTS

| | | | | |
|---|---|---|---|---|
| 2006/0057999 A1* | 3/2006 | Behzad | ............... | H03D 7/1458 455/313 |
| 2022/0005394 A1 | 1/2022 | Kim et al. | | |

OTHER PUBLICATIONS

Kwon I., et al., “A Single-Chip CMOS Transceiver for UHF Mobile RFID Reader”, IEEE Journal of Solid-state Circuits, IEEE, USA, vol. 43, No. 3, Mar. 1, 2008, pp. 729-738.

(Continued)

*Primary Examiner* — Long Nguyen
(74) *Attorney, Agent, or Firm* — Patterson + Sheridan LLP

(57) ABSTRACT

Certain aspects of the present disclosure generally relate to electronic circuits, and more particularly, to wireless transmitters. One example apparatus generally includes: an in-phase direct-current (DC) level shifter; a quadrature DC level shifter; an in-phase voltage-to-current (V2I) converter having an input coupled to an output of the in-phase DC level shifter; a quadrature V2I converter having an input coupled to an output of the quadrature V2I converter; a bias control circuit having inputs coupled to the in-phase V2I converter and the quadrature V2I converter, an output of the bias control circuit being coupled to at least one of the in-phase DC level shifter or the quadrature DC level shifter; an in-phase mixer having an input coupled to an output of the in-phase V2I converter; and a quadrature mixer having an input coupled to an output of the quadrature V2I converter.

30 Claims, 16 Drawing Sheets

(58) Field of Classification Search
CPC ............ G05F 1/561; H04B 2001/0408; H04B 2001/0416; H04B 2001/045
See application file for complete search history.

(56) References Cited

OTHER PUBLICATIONS

Partial International Search Report—PCT/US2024/011352—ISA/EPO—Apr. 22, 2024.
International Search Report and Written Opinion—PCT/US2024/011352—ISA/EPO—Jun. 19, 2024.
Praveen M.V., et al., “High Linearity Transmit Power Mixers Using Baseband Current Feedback”, IEEE Journal of Solid-State Circuits, IEEE, USA, vol. 55, No. 2, Feb. 1, 2020, XP011768812, pp. 272-281, the whole document.

* cited by examiner

500
TX7
TX0
509
PHASE INTERPOLATOR
I/Q FILTERS
4
VDD
DAC
522
518
ANTI-ALIASING FILTER
550
LO GENERATOR AND DLL
8
I45/Q45 FILTERS
PHASE INTERPOLATOR
532
I/Q
586
580
571
HRM
GND
VDD
560
573
581
587
VDS-I
VDS-Q
VDS-REF
502
563
565
533
590
I/Q/I45/Q45
591
593
V21
2
505
SIGNAL PATH (BAND GROUP 1)
SIGNAL PATH (BAND GROUP 2)
507
508
I45/Q45
VDS-I45
VDS-Q45
504
531
564
562
592
585
583
520
582
584

=

+

WIRELESS TRANSMITTER WITH BIAS CONTROL

CROSS-REFERENCE TO RELATED APPLICATION

The present application for patent claims the benefit of priority to U.S. Provisional Patent Appl. No. 63/485,996, filed Feb. 20, 2023, which is hereby incorporated by reference herein in its entirety.

TECHNICAL FIELD

Certain aspects of the present disclosure generally relate to electronic circuits, and more particularly, to wireless transmitters.

BACKGROUND

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system). Wireless devices may include transmitters for processing signals for transmission via one or more antennas.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled “Detailed Description,” one will understand how the features of this disclosure provide the advantages described herein.

Certain aspects of the present disclosure are directed towards an apparatus for wireless communication. The apparatus generally includes: an in-phase direct-current (DC) level shifter and a quadrature DC level shifter; an in-phase voltage-to-current (V2I) converter having an input coupled to an output of the in-phase DC level shifter and a quadrature V2I converter having an input coupled to an output of the quadrature V2I converter; a bias control circuit having inputs coupled to the in-phase V2I converter and the quadrature V2I converter, an output of the bias control circuit being coupled to at least one of the in-phase DC level shifter or the quadrature DC level shifter; and an in-phase mixer having an input coupled to an output of the in-phase V2I converter and a quadrature mixer having an input coupled to an output of the quadrature V2I converter.

Certain aspects of the present disclosure are directed towards a method for wireless communication. The method generally includes: generating, via an in-phase DC level shifter, an in-phase level-shifted signal; generating, via a quadrature DC level shifter, a quadrature level-shifted signal; converting, via an in-phase V2I converter, the in-phase level-shifted signal to an in-phase current; converting, via a quadrature V2I converter, the quadrature level-shifted signal to a quadrature current; sensing, via a bias control circuit, signals at nodes of the in-phase V2I converter and the quadrature V2I converter; providing a bias signal to at least one of the in-phase DC level shifter or the quadrature DC level shifter based on the sensing; generating, via an in-phase mixer, an upconverted in-phase signal based on the in-phase current; and generating, via a quadrature mixer, an upconverted quadrature signal based on the quadrature current.

Certain aspects of the present disclosure are directed towards an apparatus for wireless communication. The apparatus generally includes: an in-phase direct-current (DC) level shifter and a quadrature DC level shifter; an in-phase voltage-to-current (V2I) converter having an input coupled to an output of the in-phase DC level shifter and a quadrature V2I converter having an input coupled to an output of the quadrature V2I converter; an in-phase mixer having an input coupled to an output of the in-phase V2I converter and a quadrature mixer having an input coupled to an output of the quadrature V2I converter; a current-sensing circuit having inputs coupled to a positive differential output and a negative differential output of at least one of the in-phase mixer or the quadrature mixer; and a digital-to-analog converter (DAC) having an input coupled to the current-sensing circuit and an output coupled to the at least one of the in-phase V2I converter or the quadrature V2I converter.

Certain aspects of the present disclosure are directed towards a method for wireless communication. The method generally includes: generating, via an in-phase direct-current (DC) level shifter, an in-phase level-shifted signal; generating, via a quadrature DC level shifter, a quadrature level-shifted signal; converting, via an in-phase voltage-to-current (V2I) converter, the in-phase level-shifted signal to an in-phase current; converting, via a quadrature V2I converter, the quadrature level-shifted signal to a quadrature current; sensing, via a current-sensing circuit, a positive differential output current and a negative differential output current of at least one of an in-phase mixer or a quadrature mixer, wherein at least one of the in-phase current or the quadrature current is generated based on the sensed positive differential output current and the sensed negative differential output current; generating, via the in-phase mixer, an upconverted in-phase signal based on the in-phase current; and generating, via the quadrature mixer, an upconverted quadrature signal based on the quadrature current.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to a wireless transmitter implemented with bias control. The transmitter may include direct-current (DC) level shifters generating in-phase (I) and quadrature (Q) level-shifted signals. The level-shifted signals may be provided to voltage-to-current (V2I) converters for generating I and Q currents to be provided to respective mixers for upconversion. In some aspects, the transmitter may include a bias control circuit configured to bias source followers (SFs) of the DC level shifters based on drain-to-source voltages associated with tail current sources of the V2I converters, improving the linearity of the transmitter, as described in more detail herein. In some aspects, the transmitter may include current-sensing circuits configured to sense output currents of mixers for calibrating the mixers (e.g., by controlling the V2I converters). The transmitter may also include signal paths implemented with circuitry for gain control. For example, each signal path may include switches for redirecting current from a forward current path to a reverse current path for gain control, as described in more detail herein.

Example Wireless Communications

Figure 1:
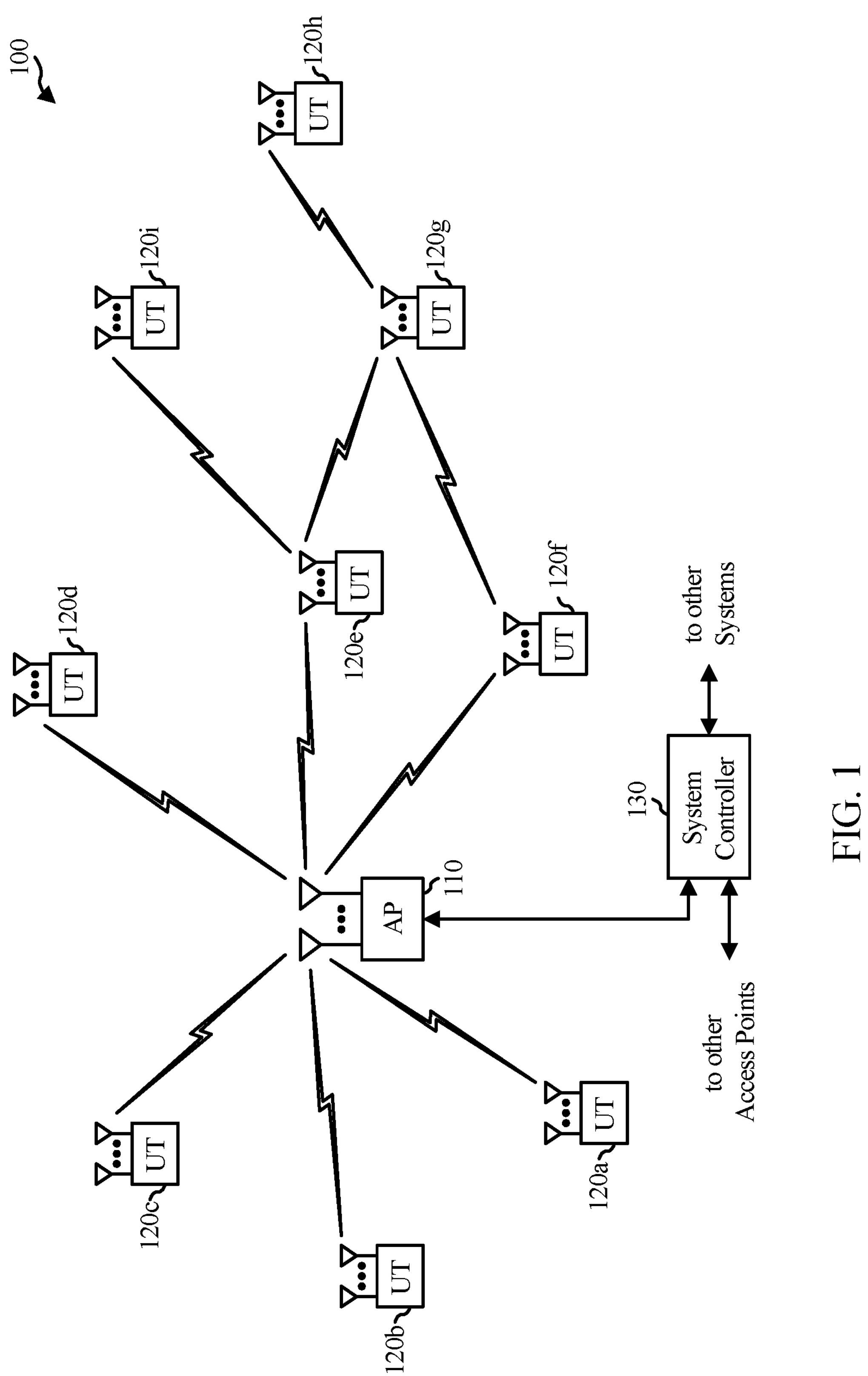
FIG. 1 is a diagram of an example wireless communications network, in which aspects of the present disclosure may be practiced.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). The user terminal 120 or access point 110 may include a transmitter chain having a predistortion bias control circuit and, in some aspects, a current-sensing circuit to calibrate one or more mixers, as described in more detail herein.

Figure 2:
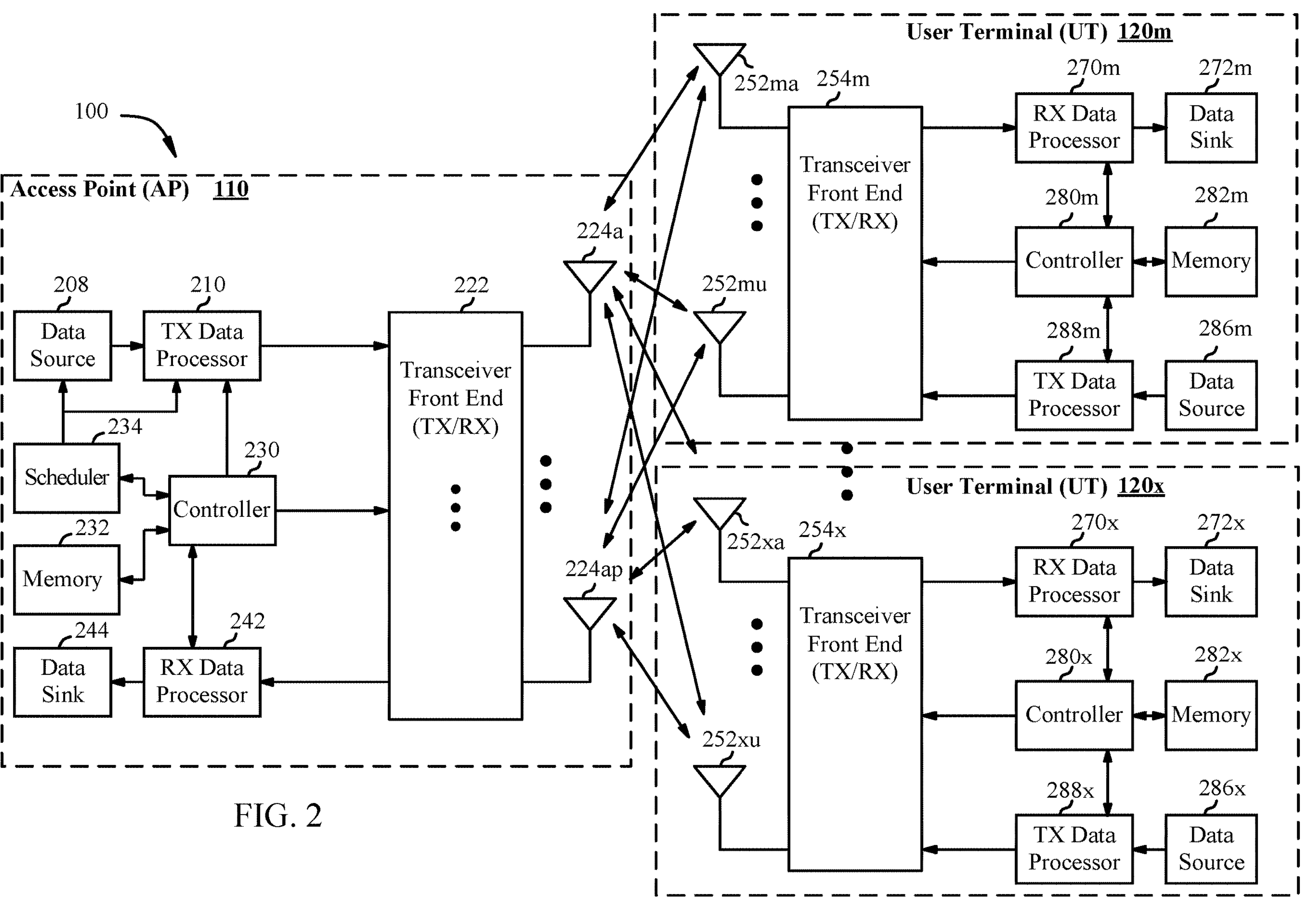
FIG. 2 is a block diagram of an example access point (AP) and example user terminals, in which aspects of the present disclosure may be practiced.

FIG. 2 shows a block diagram of access point 110 and two user terminals 120*m* and 120*x* in the wireless communications system 100. Access point 110 is equipped with $N_{ap}$ antennas 224*a* through 224*ap*. User terminal 120*m* is equipped with $N_{ut,m}$ antennas 252*ma* through 252*mu*, and user terminal 120*x* is equipped with $N_{ut,x}$ antennas 252*xa* through 252*xu*. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224*a* through 224*ap* receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal. The transceiver front end 222 may include a transmitter chain having a predistortion bias control circuit and, in some aspects, a current-sensing circuit to calibrate one or more mixers, as described in more detail herein.

Figure 3:
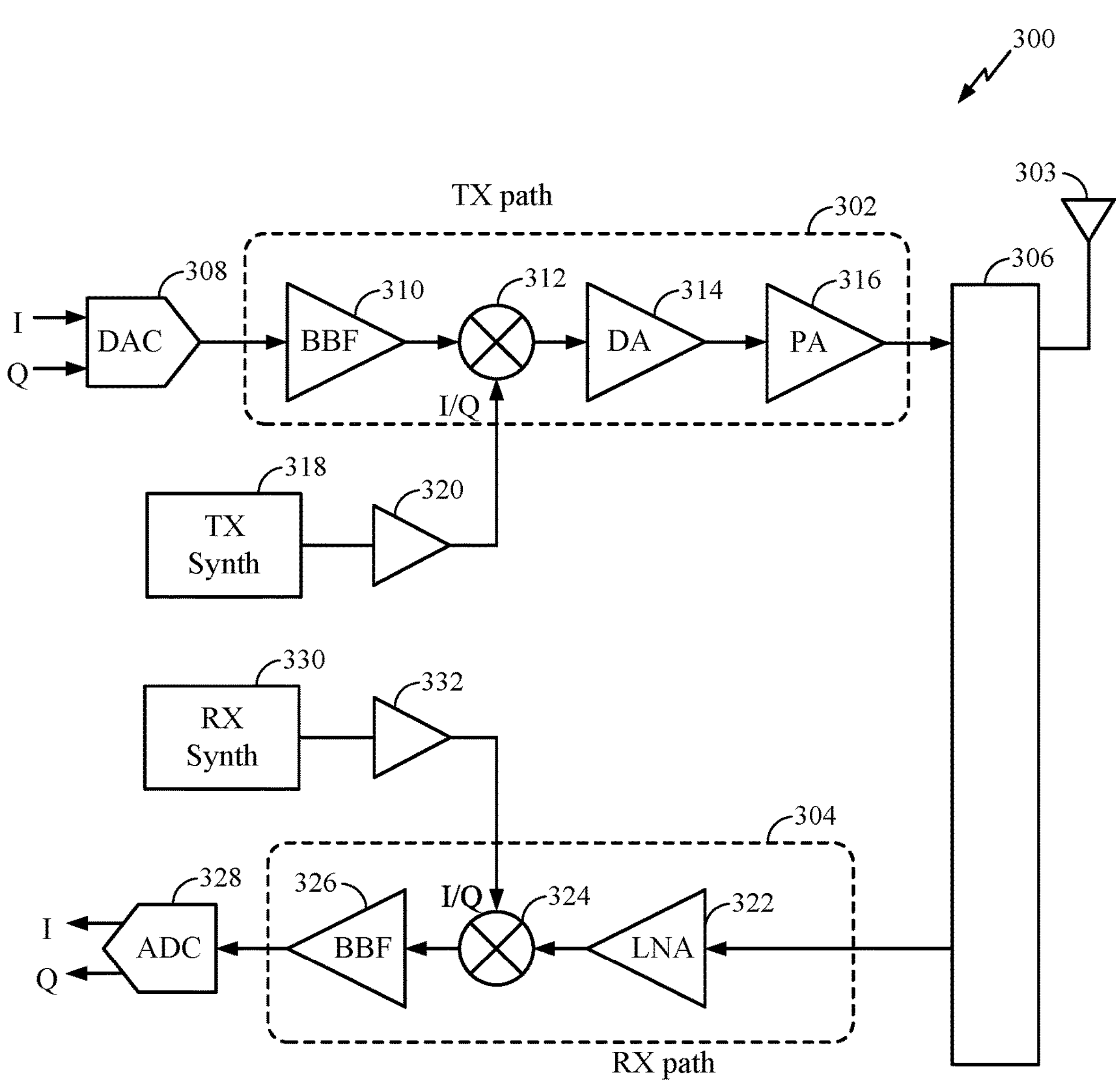
FIG. 3 is a block diagram of an example transceiver front end, in which aspects of the present disclosure may be practiced.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The DAC 308 may include current steering cells and may be configured to selectively disable one or more of the current steering cells to reduce power consumption, as described in more detail below. The BBF 310, the mixer 312, and the DA 314 may be included in a radio frequency integrated circuit (RFIC), while the PA 316 may be external to the RFIC.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. In some aspects, the transceiver front end 300 may include a predistortion bias control circuit and, in some aspects, a current-sensing circuit to calibrate one or more mixers such as mixer 312, as described in more detail herein.

Example Wireless Transmitter

Certain aspects of the present disclosure generally relate to a wireless transmitter supporting wideband (WB) operations with improved linearity as compared to conventional implementations. The wireless transmitter described herein may be used in any suitable wireless device, such as a base transmitter station (BTS) (e.g., a base station). Designing BTS transmitters may involve simultaneous multi-user communication having stringent specifications on adjacent channel emissions. BTS transmitters may support 1024-quadrature amplitude modulation (QAM) with high signal-to-noise ratio (SNR) to meet stringent noise, mismatch, and in-band emissions specifications. BTS transmitters may have to comply with stringent Federal Communications Commission (FCC) or other regulatory agencies' specifications on spectrum emission mask (SEM). BTS transmitters may support non-contiguous user communications or radio access network (RAN) sharing with high linearity wideband support of front-end (FE) digital pre-distortion (DPD) linearization. BTS transmitters may support multi-user (Mu)-multiple input multiple output (MIMO) (MIMO and beam forming (BF)) including matching and tracking between transmitter chains.

Figure 4:
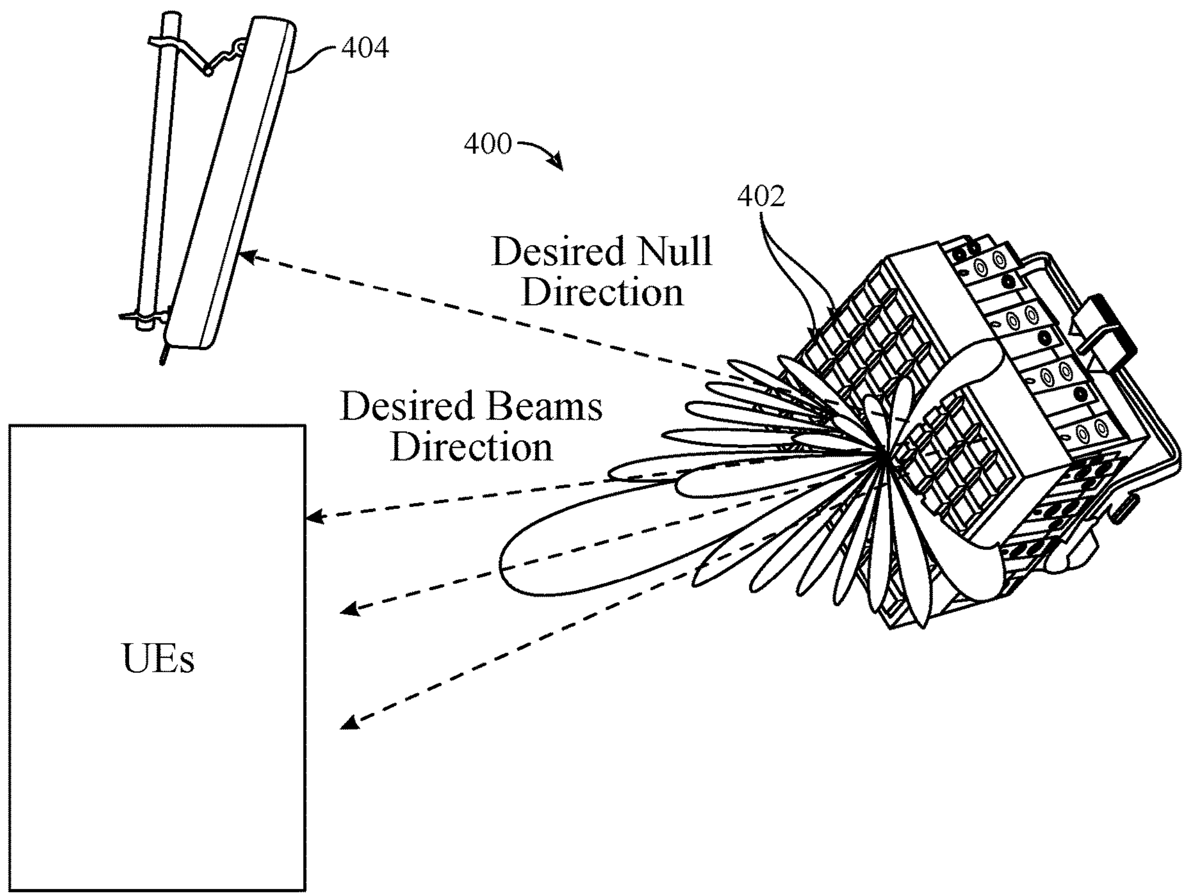
FIG. 4 illustrates an example multiple-input, multiple-output (MIMO) transmitter.

FIG. 4 illustrates an example MIMO transmitter 400. As shown, using various radiating elements 402, one or more communication beams may be generated towards one or more UEs (e.g., toward directions labeled "Desired Beams Directions"). In some aspects, a null beam may be generated toward an object 404, as shown. A null beam may refer to a direction of transmission with reduced gain (e.g., as compared to the Desired Beams Directions). In some cases, the null beam may be used to reduce interference with one or more devices during transmission.

Figure 5A:
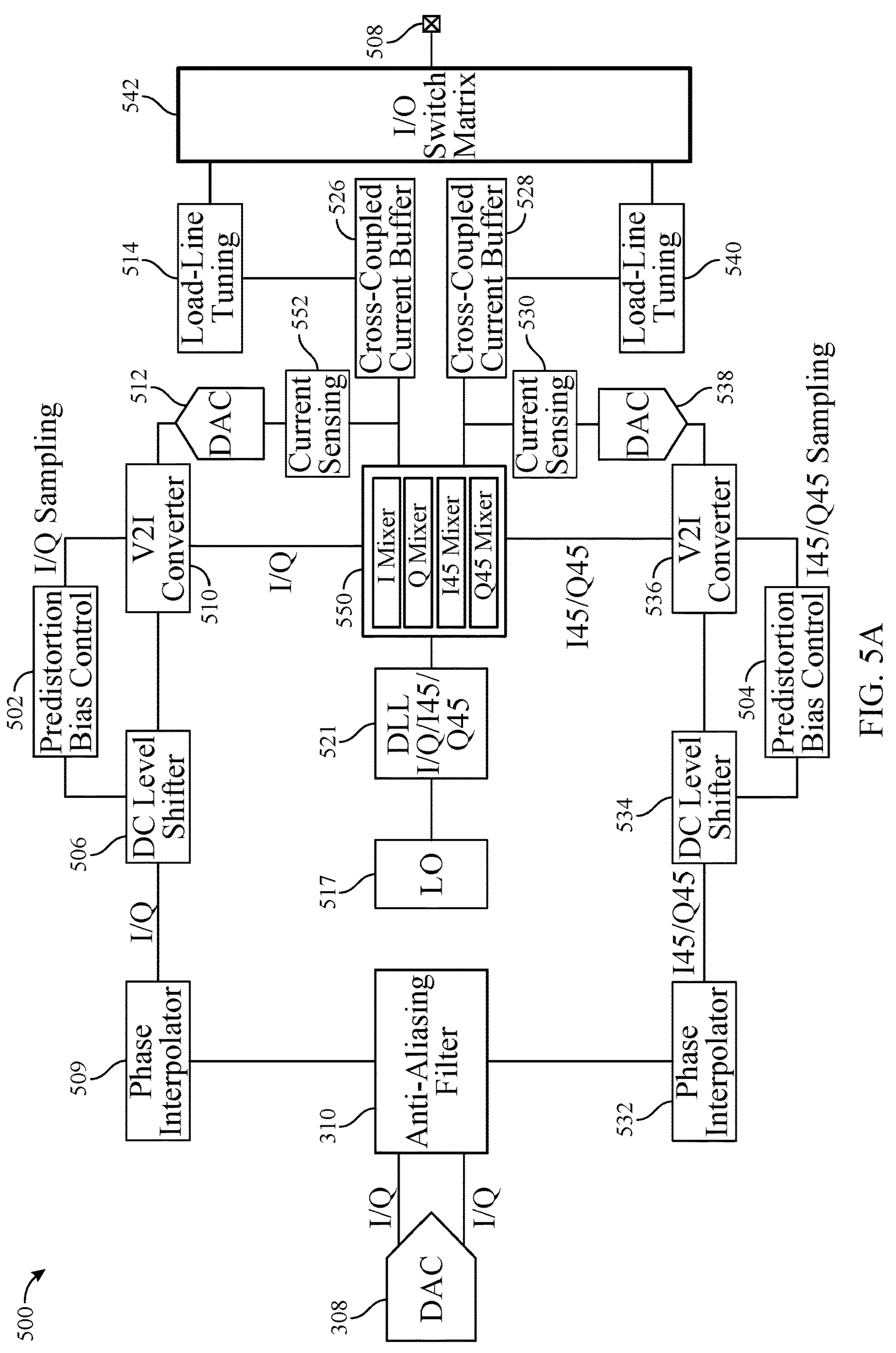
FIGS. 5A and 5B illustrate an example transmitter chain, in accordance with certain aspects of the present disclosure.
Figure 5B:
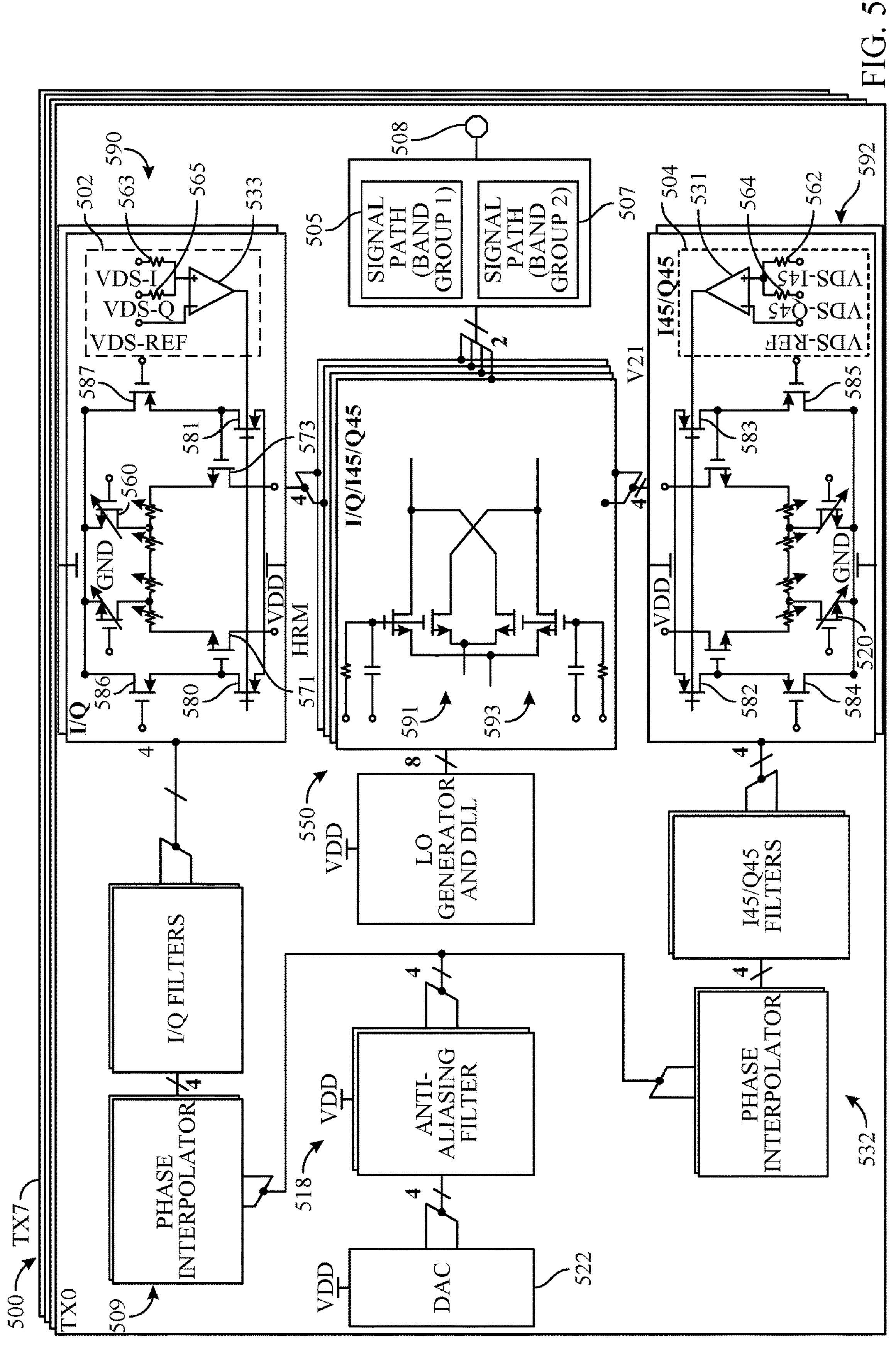

FIGS. 5A and 5B illustrate an example transmitter chain 500, in accordance with certain aspects of the present disclosure. The chain 500 may include a DAC 308 to provide in-phase (I) and quadrature (Q) signals to filter 310 (e.g., an anti-aliasing filter). The filter 310 may be coupled to phase interpolators 509, 532. The phase interpolators 509, 532 may be used to perform phase adjustment. I and Q phase interpolators 509 may provide in-phase (I) and quadrature (Q) signals to respective I and Q direct current (DC) level shifters 506, and I and Q phase interpolators 532 may provide an I signal with 45-degree phase offset (I45) and a Q signal with 45-degree phase offset (Q45) to respective I45 and Q45 DC level shifters 534. The DC level shifters 506, 534 generate DC level-shifted signals provided to respective voltage-to-current (V2I) converters 510, 536, which may generate currents (e.g., I, Q, I45, and Q45 currents) to be provided to mixers 550 for upconversion. The mixers 550 may include an I mixer, a Q mixer, an I45 mixer and a Q45 mixer, as shown. The mixers 550 may be implemented as harmonic rejection mixers (HRMs) for upconversion. As shown, an LO signal generator 517 may generate an LO signal, which may be provided to a delay-locked loop (DLL) 521 for generating I, Q, I45, and Q45 LO signals to be provided to the mixers 550.

The chain 500 may include a predistortion bias control circuit 502 in some aspects. The predistortion bias control circuit 502 may receive I and Q samples (e.g., labeled "I/Q sampling") from the V2I converters 510 and may bias the DC level shifters 506 based on the I and Q samples, as described in more detail herein. Based on I and Q DC level-shifted signals from the DC level shifters 506, the V2I converters 510 generate respective I and Q currents provided to I and Q mixers of mixers 550, as described. Similarly, the chain 500 may include a predistortion bias control circuit 504. The predistortion bias control circuit 504 may receive I45 and Q45 samples (e.g., labeled "I45/Q45 sampling") from the V2I converters 536 and may bias the DC level shifters 534 based on the I45 and Q45 samples. Based on I45 and Q45 DC level-shifted signals from the DC level shifters 506, the V2I converters 536 generate respective I45 and Q45 currents provided to I45 and Q45 mixers of mixers 550.

As shown, a current-sensing circuit 552 and current-sensing circuit 530 may be coupled to the outputs of the mixers 550, as shown. The current-sensing circuits 552, 530 may sense output currents of the mixers for calibrating the mixers 550, as described in more detail herein. For example, the current-sensing circuits 552, 530 may generate calibration signals provided to respective DACs 512, 538. The DACs 512, 538 may output an analog signal to respective V2I converters 510, 536. The analog signals from the DACs 512, 538 may be used to sink currents via respective V2I converters 510, 536 from the mixers 550, as described in more detail herein. For example, the output voltage from the DAC 512 may be converted to a current using the V2I converter 510 to bias the mixers 550. The mixers 550 may be coupled to signal paths 505, 507 coupled to a port 508.

The mixers 550 may be coupled to multiple cross-coupled current buffers 526, 528. The current buffers 526, 528 are provided to an input/output (I/O) switch matrix 542 through load-line tuning circuits 514, 540. The I/O switch matrix 542 may be coupled to an I/O pin (e.g., also referred to herein as a "transmitter port 508"). The mixers 550 operate based on 8 phases (e.g., providing differential I signals, differential Q signals, differential I45 signals, and differential Q45 signals).

FIG. 5B illustrates an example implementation of the transmitter chain 500, in accordance with certain aspects of the present disclosure. As shown, the chain 500 may be implemented for multiple transmitters (e.g., eight transmitters labeled "TX0" to "TX7"). As shown in FIG. 5B, the chain 500 may include single-pole transimpedance amplifiers (TIAs) 518 (e.g., as part of a baseband filter (BBF), labeled "anti-aliasing filter"). The anti-aliasing filter with the TIAs 518 may correspond to filter 310 described with respect to FIG. 5A. As illustrated, the chain 500 may include I and Q level shifter and V2I converter circuits 590 (e.g., corresponding to I and Q DC level shifters 506 and I and Q V2I converters 510 of FIG. 5A). The chain 500 may also include I and Q level shifter and V2I converter circuits 592 (e.g., corresponding to I and Q DC level shifters 534 and I and Q V2I converters 536 of FIG. 5A).

To implement the DC level shifters 506, the circuit 590 may include a p-channel metal-oxide-semiconductor (PMOS) source follower (SF) stage including a PMOS transistor 580 coupled to an input PMOS transistor 586 and a PMOS SF stage including PMOS transistor 581 coupled to an input PMOS transistor 587. To implement the DC level shifters 534, the circuit 592 may include a PMOS SF stage including a PMOS transistor 582 coupled to input PMOS transistor 584 and a PMOS SF stage including a PMOS transistor 583 coupled to input PMOS transistor 585. The input PMOS transistors receive differential signals from respective phase interpolators. The SF stages DC couple the phase interpolator output from a lower voltage (e.g., 1.2 V) domain to respective mixer n-channel metal-oxide-semiconductor (NMOS) transconductance (Gm) cells (e.g., corresponding to V2I converters 510, 536) under a higher voltage (e.g., 1.8 V) domain. The SF also acts as a buffer stage between the Gm cell and the TIA (e.g., TIAs 518) and balances tail device voltages at slow-slow (SS) and fast-fast (FF) corners. As shown, each V2I converter may include transistors (e.g., transistors 571, 573) having gates coupled to an output of a respective SF stage of the DC level shifter. For example, the gate of transistor 573 may be coupled to a node (e.g., DC level shifter output) between transistors 581, 587, as shown.

The chain 500 may include predistortion bias control circuits 502, 504, as described herein. The gates of SF stage PMOS transistors (e.g., PMOS transistors 580, 581) may be biased based on an average of drain-to-source voltages of transistors used to implement tail current sources for the V2I circuits. For example, the gates of PMOS transistors 582, 583 may be biased via a sensing amplifier 531 of the bias control circuit 504. The sensing amplifier 531 may receive a drain-to-source voltage (VDs-I45) of the tail current source (e.g., tail device 520) for the I45 V2I circuit and a drain-to-source voltage (VDs-Q45) of the tail current source (not shown) for the Q45 V2I circuit, through respective resistive elements 562, 564 as shown. Thus, the positive input of sensing amplifier 531 may receive a voltage representing the average of the drain-to-source voltages associated with the tail current sources for the I45 and Q45 signals. Since the common-mode (CM) harmonics of quadrature signals are out of phase, the sensing amplifier may only feed a DC operating point to the SF or DC shifting stage. This quadrature-sensing scheme is important to maintain linearity. The sensing amplifier 531 may drive the gates of the SF PMOS transistors so that the average of the tail device drain-to-source voltages is equal to a reference voltage (VDS-REF), thereby reducing CM harmonics. The operating bias of the sensing amplifier 531, together with the DC level shifter stage may be chosen such that the V2I converter current-voltage (I-V) characteristic is inverse to the rest of the signal path, thereby creating an overall flat I-V response in an operating power range, improving linearity, as described in more detail with respect to FIG. 5C.

Figure 5C:
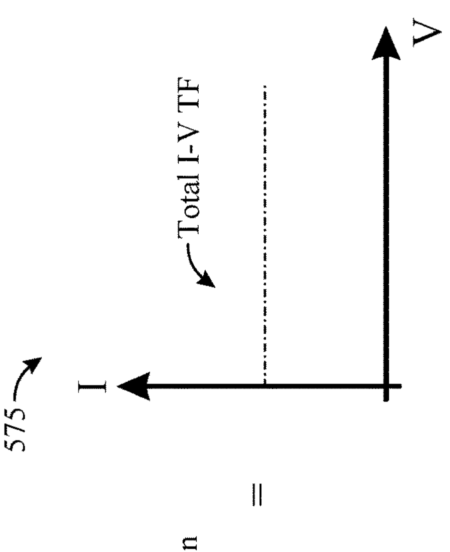
FIG. 5C illustrates current-voltage (I-V) characteristics associated with a transmitter chain, in accordance with certain aspects of the present disclosure.
Figure 5C:
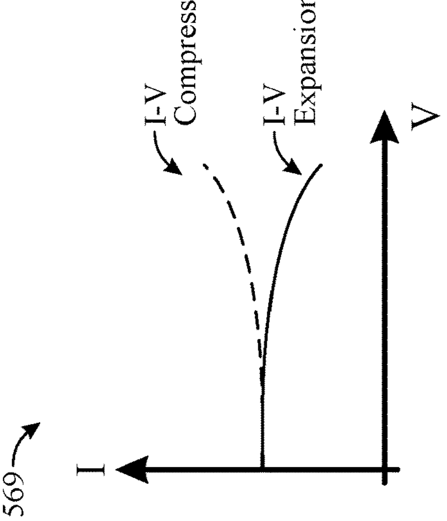
Figure 5C:
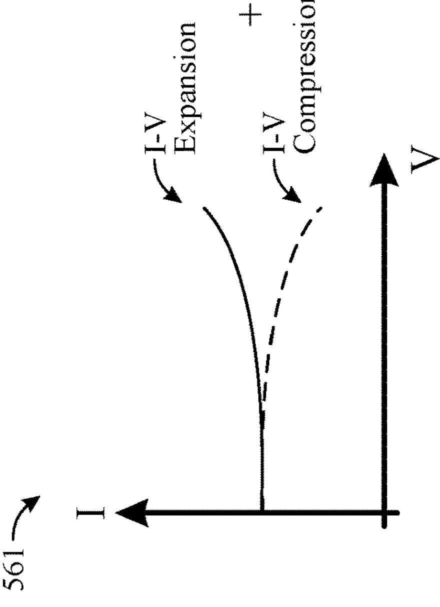

FIG. 5C illustrates I-V characteristics associated with the chain 500, in accordance with certain aspects of the present disclosure. The DC level shifter (e.g., level shifter 534 shown in FIG. 5A) provides an I-V characteristic as shown in graph 561. For instance, the level shifter and sensing amplifier may be biased to have an I-V expansion transfer function (TF) (e.g., associated with amplification gain expansion) and an I-V compression TF (e.g., associated with amplification gain compression), as shown in graph 561. The associated V2I converter (e.g., 536 shown in FIG. 5A) may have I-V expansion and compression TFs as shown in graph 569. Thus, the combined I-V expansion and compression TFs may be linear, as shown in graph 575.

Returning to FIG. 5B, the gates of PMOS transistors 580, 581 may be biased via a sensing amplifier 533 of the bias control circuit 502. The sensing amplifier 533 may receive a drain-to-source voltage (VDs-I) of the tail current source (e.g., tail device 560) for the I V2I circuit and a drain-to-source voltage (VDS-Q) of the tail current source (not shown) for the Q V2I circuit, through respective resistive elements 563, 565, as shown. Thus, the positive input of sensing amplifier 533 may receive a voltage representing the average of the drain-to-source voltages of the tail current sources for the I and Q signals, which is compared to VDS-REF, based on which the gate voltages of the PMOS transistors 580, 581 are controlled.

The PMOS SF stages also provide headroom for the tail devices (e.g., tail device 520). While a PMOS SF stage is shown to facilitate understanding, an NMOS SF stage may be used in some cases (e.g., driven by a PMOS stage). In some cases, Gm-cell degeneration may be used (e.g., include more than 15 dB loop gain the DPD bandwidth (BW)). In some aspects, split degeneration may be used to reduce the noise contribution of the tail devices. Tail current source expansion (as shown in graph 561 in FIG. 5C) helps in improving adjacent channel leakage ratio (ACLR). In some aspects, a floating source degeneration may be used (e.g., with 20 dB wideband (WB) loop gain), which helps linearize the Gm cell to meet ACLR specifications.

As shown in FIG. 5B, two signal paths 505, 507 may be provided for different bands (e.g., one for low/medium/high (LMH) bands, and another for new-radio (NR)/NR-unlicensed (U) bands). The cross-coupled current buffers 526, 528 (shown in FIG. 5A) have different controls which can be used to adjust the amount of current reaching the load (e.g., a balanced-to-unbalanced (balun) component) and hence, may be used for gain control. The devices for implementing the cross-coupled current buffers may be smaller as compared to current-steering gain control circuits. Moreover, unlike current-steering gain control circuits, the cross-coupled current buffers may not inject current into the supply, which reduces crosstalk.

Figure 6:
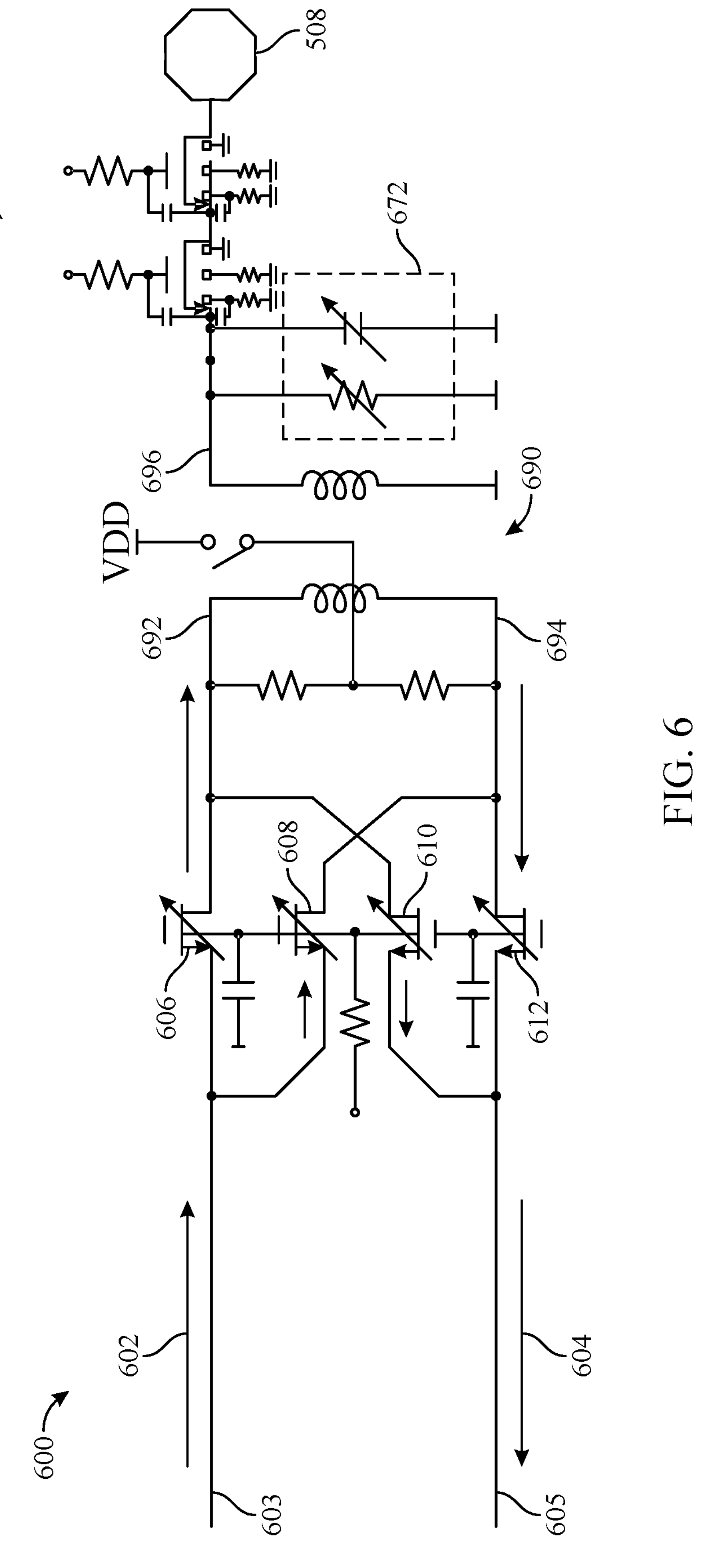
FIG. 6 illustrates an example signal path of a transmitter chain, in accordance with certain aspects of the present disclosure.

FIG. 6 illustrates an example signal path 600 (e.g., corresponding to signal path 505 or signal path 507 of FIG. 5B), in accordance with certain aspects of the present disclosure. The signal path 600 may be implemented as a gain control circuit, in some aspects. As shown, the signal path 600 may include a forward current path 602 (e.g., from a first differential node 603 of the signal path to a balun 690), a return current path 604 (e.g., from the balun 690 to a second differential node 605 of the signal path), and transistors 606, 608, 610, 612. The differential nodes 603, 605 may be differential outputs of mixers 550. The transistors 606, 608, 610, 612 may be tunable, allowing for gain control.

Transistor 606 may be coupled between the differential node 603 and a terminal 692 (e.g., referred to herein as a "first balanced terminal") of the balun 690, and transistor 612 is coupled between the differential node 605 and a terminal 694 (e.g., referred to herein as a "second balanced terminal") of the balun 690. Transistor 608 may be coupled between the differential node 603 and terminal 694, and transistor 610 may be coupled between the terminal 692 and differential node 605. To control signal gain, transistors 608, 610 (e.g., corresponding to cross-coupled current buffer 526 or 528 shown in FIG. 5A) may be controlled to redirect at least a portion of current from the forward current path 602 to the return current path 604, as shown. Thus, the redirected current bypasses the balun 690 to adjust the signal gain.

A terminal 696 (e.g., referred to herein as an "unbalanced terminal") of the balun 690 may be coupled to the port 508 through switches 670 (e.g., corresponding to the I/O switch matrix 542 of FIG. 5A). The port 508 may be common for both signal paths 505, 507 as shown in FIG. 5B. As illustrated in FIG. 6, terminal 696 may be coupled to a load-line tuning circuit 672 (e.g., corresponding to load-line tuning circuit 514 or 540 of FIG. 5A).

While two signal paths 505, 507 are shown in FIG. 5B, any number of signal paths may be used for any number of bands or band groupings. Each signal path may include a WB balun (e.g., balun 690), as shown. The signal paths 505, 507 may include thick oxide cascoded structures (transistors 608, 610, 606, 612) to isolate the I/Q summing node (e.g., in the I/O switching matrix 542, just before the port 508) from the load and supply impedance variation (e.g., using on/off state machine for device breakdown protection). The integrated WB baluns convert differential signals into single-ended (SE) outputs. The signal paths may be multiplexed into one input/output (I/O) pin (e.g., port 508) coupled to an input of a drive amplifier (DA) (e.g., DA 314 of FIG. 3). On-chip per-phase mixer current calibration may be used to compensate, or at least adjust, for local and global mismatches, as described in more detail herein. In some aspects, the switches of the signal path 505 or 507 may be biased in saturation to activate the associated band. The switches of the HRM (e.g., switches 591, 593) may be biased in the triode region. The BBF may be implemented as an anti-alias active filter (e.g., anti-aliasing filter 310 shown in FIG. 5A) followed by a passive pole.

Some transceiver architectures are designed to meet sideband emissions with low current consumption (e.g., using a passive mixer and HRM). Some implementations may include an HRM DAC and an HRM LO. A passive mixer may include a tuned transformer that serves multiple purposes, including CM rejection, a real impedance load, and low swing across passive components for good linearity. A DA may follow the passive mixer for power amplification.

The transceiver of the present disclosure may be designed to meet fast radio burst (FRB) operating band unwanted emissions (OBUE) and out-of-band (OOB) emission specifications. The transceiver may include an active mixer and HRM. The active mixer may use source degeneration to linearize the Gm cell. As described, the active mixer differential output may be converted to a single-ended output by a balun (e.g., an on-chip wideband balun).

Figure 7:
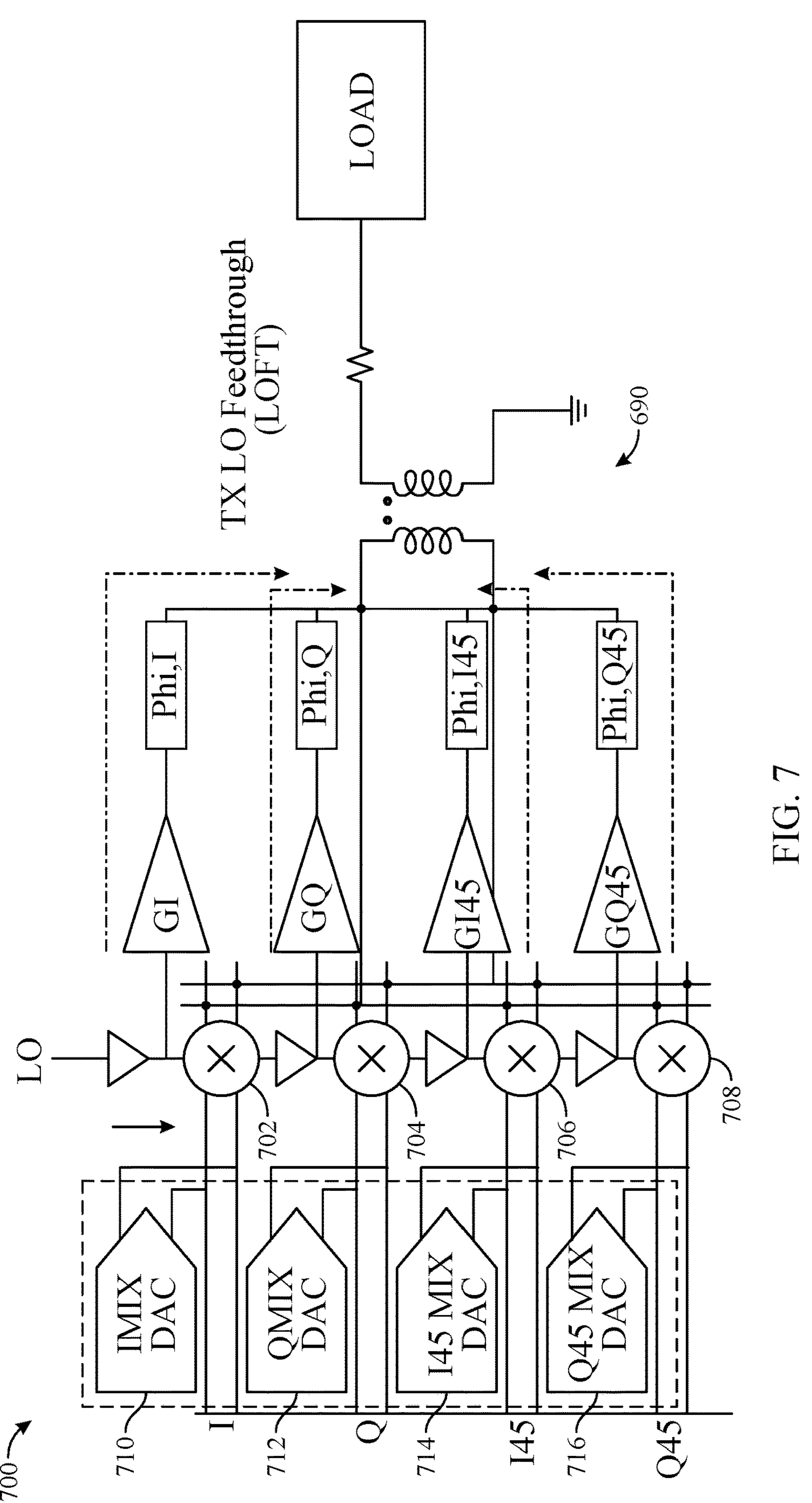
FIG. 7 illustrates local oscillator (LO)-leakage calibration circuitry, in accordance with certain aspects of the present disclosure.

FIG. 7 illustrates local oscillator (LO)-leakage calibration circuitry 700, in accordance with certain aspects of the present disclosure. As shown, multiple DACs 710, 712, 714, 716 may be used to provide calibration current for reducing mismatch associated with respective I mixer 702, Q mixer 704, I45 mixer 706, and Q45 mixer 708. The DACs 710, 712 (for I and Q) may correspond to the DAC 512 shown in FIG. 5A and the DACs 714, 716 (for I45 and Q45) may correspond to the DAC 538 shown in FIG. 5A. As shown, the output of the mixers 702, 704, 706, 708 may be coupled to the balun 690. LO leakage may be caused by DC offset and LO feedthrough (LOFT). As shown, LOFT refers to the electrical coupling of the LO signal to the mixer output, which may also encounter gain and phase adjustments, represented by respective gain adjustments labeled "GI," "GQ," "GI45," and "GQ45" and respective phase adjustment circuits labeled "Phi,I," "Phi,Q," "Phi,I45," and "Phi, Q45." In multi-phase mixers, LO leakage through each phase may not be correlated. LO leakage may be calibrated by I/Q DC online calibration (DCOC) blocks in the digital domain, which may only have calibration for I and Q phases.

When leakage paths are uncorrelated, multiple distinct calibration settings may be present. Therefore, correlation between different leakage paths is important. In some cases, DC offset may be corrected at the source (e.g., at the output of DAC 522). In some aspects, HRMs are employed in high-performance transmitters to cancel third- and fifth-order harmonics of LO as well as 4FMODs (e.g., frequency at four times BB frequency). The amount of harmonic rejection depends on the amplitude and phase mismatch of LO as well as BB signals. Certain aspects are directed to techniques for calibrating amplitude and phase of the BB/LO signal.

Figure 8:
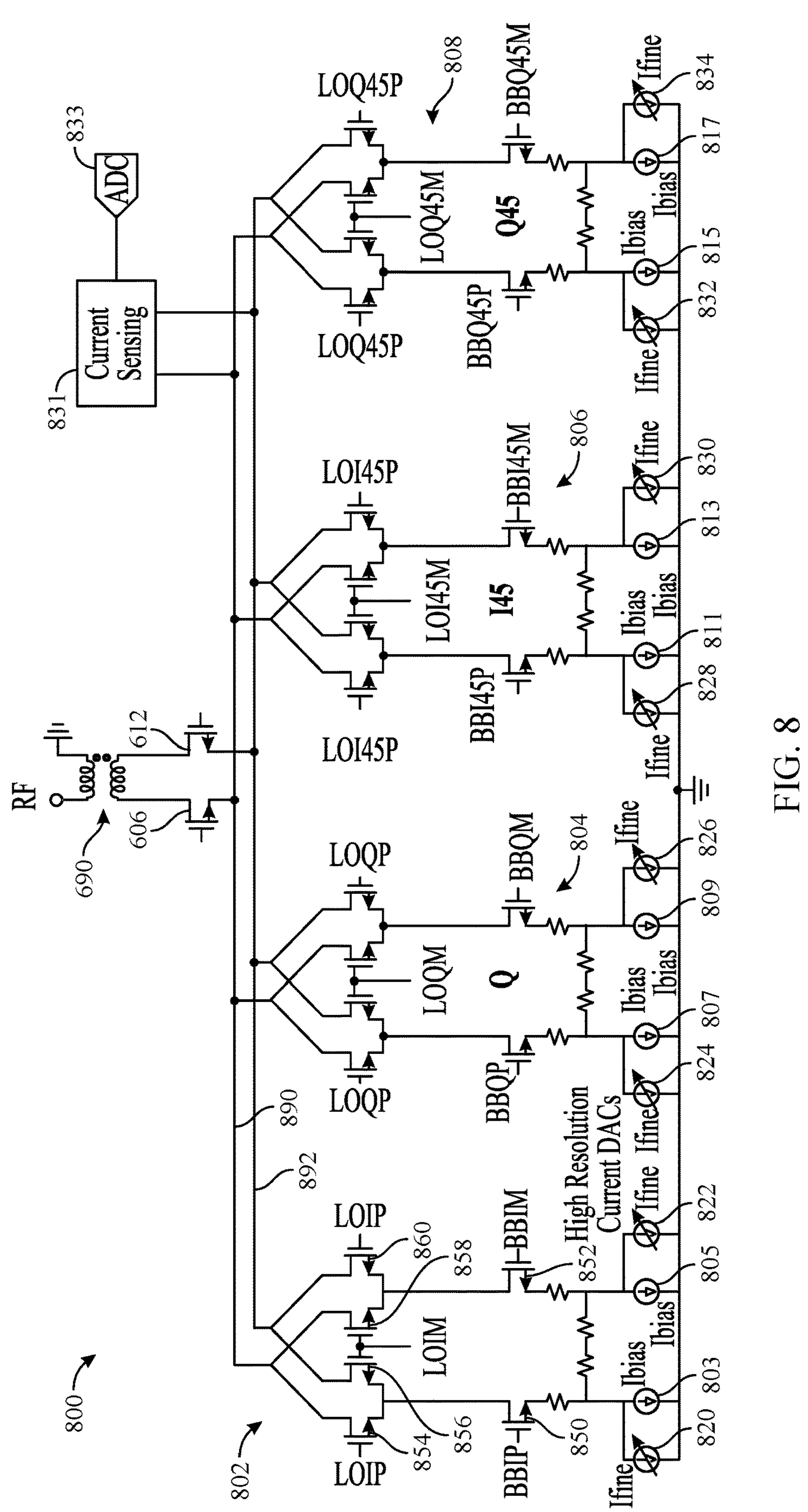
FIG. 8 illustrates mixer circuitry, in accordance with certain aspects of the present disclosure.

FIG. 8 illustrates mixer circuitry 800 including an HRM 802 for I signal upconversion, an HRM 804 for Q signal upconversion, an HRM 806 for I45 signal upconversion, and an HRM 808 for Q45 signal upconversion, in accordance with certain aspects of the present disclosure. Each HRM includes bias current sources (Ibias) for each differential path and a calibration current source (Ifine) (e.g., implemented by high-resolution current DACs) in parallel with each bias current source, as shown. For example, HRM 802 may include bias current sources 803, 805, HRM 804 may include bias current sources 807, 809, HRM 806 may include bias current sources 811, 813, and HRM 808 may include bias current sources 815, 817. Continuing with this example, calibration current sources 820, 822, 824, 826, 828, 830, 832, 834 may be coupled in parallel with respective bias current sources 803, 805, 807, 809, 811, 813, 815, 817, as shown. At least some of the calibration current sources 820, 822, 824, 826, 828, 830, 832, 834 may be adjustable. In some aspects, each of the calibration current sources 820, 822, 824, 826, 828, 830, 832, 834 may be coupled in parallel with a respective tail current source of the V2I circuits described with respect to FIGS. 5A and 5B. For example, the calibration current source 822 may be coupled in parallel with tail device 560, providing a calibration current (e.g., together with a bias current) for a respective mixer.

A current-sensing circuit 831 (e.g., corresponding to current-sensing circuits 552, 530 of FIG. 5A) may be coupled between the differential outputs 890, 892 of the HRMs and a calibration ADC 833, as shown. Each of the bias current sources biases (e.g., sinks a current Ibias from) a respective BB input transistor, and each of the calibration current sources calibrates (e.g., a sinks a current Ifine from) a respective BB input transistor, as shown. For example, HRM 802 may include a positive BB input (BBIP) transistor 850 (e.g., having a gate receiving a BBIP signal) and a negative BB input (BBIM) transistor 852 (e.g., having a gate receiving a BBIM signal). The sources of transistors 850, 852 may be coupled to respective current sources 803, 805, as shown. A drain of the BBIP transistor 850 may be coupled to LO input transistors 854, 856, and a drain of the BBIP transistor 852 may be coupled to LO input transistors 858, 860. The LO input transistor 854 may have a gate receiving a positive LO input (LOIP) signal, and the LO input transistor 856 may have a gate receiving a negative LO input (LOIM) signal. The LO input transistor 860 may have a gate receiving the LOIP signal, and the LO input transistor 858 may have a gate receiving the LOIM signal.

As shown, the drains of transistors 854, 858 may be coupled to a positive differential output 890 of a differential output pair of the HRMs. The drains of transistors 856, 860 may be coupled to a negative differential output 892 of the differential output pair.

Figure 9:
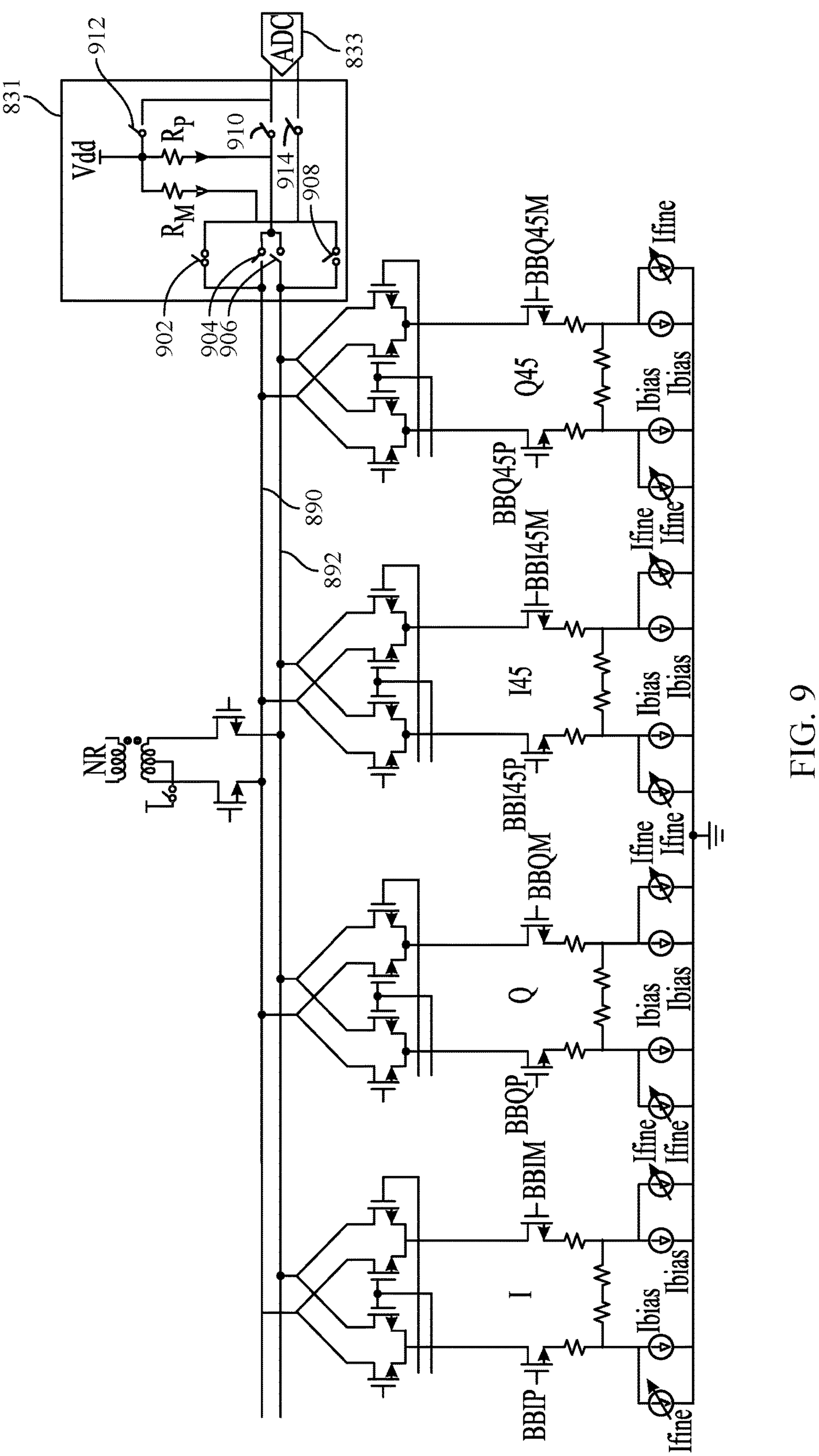
FIG. 9 illustrates switches and resistive elements of a current-sensing circuit, in accordance with certain aspects of the present disclosure.

FIG. 9 illustrates switches and resistive elements (labeled "$R_P$" and "$R_M$") of the current-sensing circuit 831, in accordance with certain aspects of the present disclosure. The resistive elements $R_P$ and $R_M$ are selectively coupled between a voltage rail (e.g., a power supply node labeled "Vdd") and respective inputs of the ADC 832. By closing switches 904, 908, the positive output 890 of the HRMs may be coupled to $R_P$ and a first input of the ADC 833, and the negative output 892 of the HRMs may be coupled to $R_M$ and a second input of the ADC 833. The ADC 833 measures the voltages at $R_P$ and $R_M$ and calibrates the HRMs (e.g., by adjusting Ifine sunk by one or more of the calibration current sources 820, 822, 824, 826, 828, 830, 832, 834) to set the voltages at $R_P$ and $R_M$ to be equal. A calibration code (e.g., representing the current setting of each of the calibration current sources) may be stored to be used during mission mode. In some aspects, a switch 912 may be coupled between the voltage rail and the first input of the ADC 833.

In some aspects, the coupling to the ADC inputs may be swapped using the switches of the current-sensing circuit 831. For example, the negative output 892 of the HRMs may be coupled to $R_P$ and the first input of the ADC 833 by closing switch 906, 910, and the positive output 890 of the HRMs may be coupled to $R_M$ and the second input of the ADC 833 by closing switch 902, 914. By performing the swapping, calibration error due to mismatch (e.g., associated with the ADC, transmission lines, or $R_P$ and $R_M$) may be reduced, as described in more detail herein.

To cancel the mismatch error, two measurements ($V_1$, $V_2$) may be performed where both $I_p$ (e.g., a positive output current of the HRMs) and $I_m$ (e.g., a negative output current of the HRMs) are routed to different resistors ($R_P$ and $R_M$) in each measurement. After DC offset calibration, DC bias current of each phase (e.g., I, Q, I45, and Q45) is equalized by scaling both $I_p$ and $I_m$, as described in more detail with respect to FIGS. 10, 11A, and 11B. Each phase of the HRM may be calibrated to the same DC bias current, equalizing Gm and improving harmonic rejection. Error associated with ADC offset and any other mismatch in the measurement path may also be cancelled (or at least reduced), as described.

Figure 10:
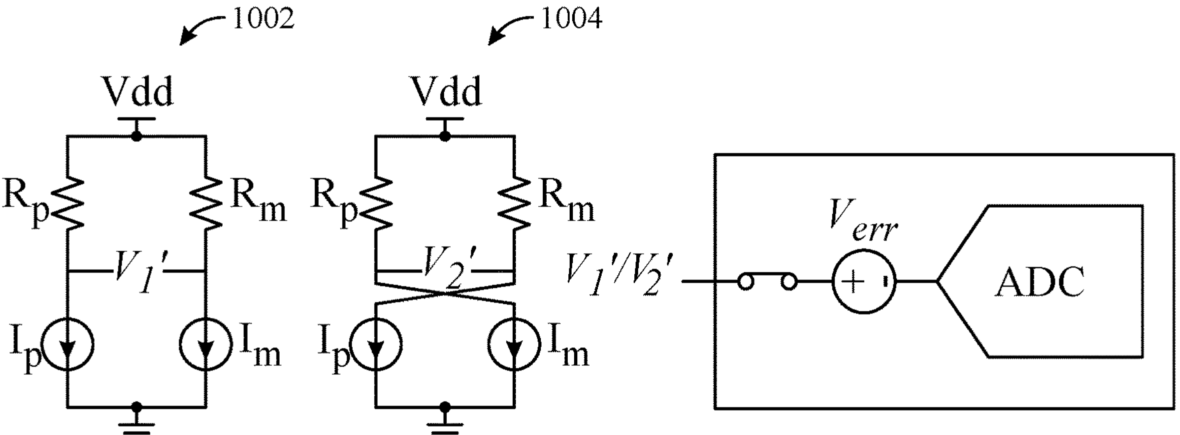
FIG. 10 illustrates swapping of converter inputs for reducing measurement error during calibration, in accordance with certain aspects of the present disclosure.

FIG. 10 illustrates swapping of ADC inputs for reducing measurement error (e.g., calibration error), in accordance with certain aspects of the present disclosure. As shown in diagram 1002, the positive output current $I_p$ of the HRMs may be sunk from $R_P$, and the negative output current $I_m$ of the HRMs may be sunk from $R_m$, such that a voltage $V_1'$ may be measured via ADC 833. After swapping as shown in diagram 1004, the positive output current $I_p$ of the HRMs may be sunk from $R_m$, and the negative output current $I_m$ of the HRMs may be sunk from $R_p$, such that a voltage $V_2'$ may be measured via ADC 833.

A voltage $V_1$ may be determined based on the following equation:

$$V_1 = V_1' + V_{err} = (I_p R_p - I_m R_m) + V_{err}$$

where $V_{err}$ is an error voltage associated with the mismatch between the resistive elements (e.g., as well as transmission line and ADC mismatch). A voltage $V_2$ may be determined based on the following equation:

$$V_2 = V_2' + V_{err} = (I_p R_m - I_m R_p) + V_{err}.$$

Assuming $R_p$=R, $R_m$=R+ΔR where ΔR represents a mismatch between $R_P$ and $R_m$, $I_p$ may be equal to $$I_{bias} + I_{offset} + I_{fine}$$

where $I_{offset}$ represents an offset between the bias current sources of the HRM (e.g., bias current sources 803, 805 of HRM 802 of FIG. 8). $I_m$ may be equal to $$I_{bias} - I_{fine}$$

Thus, $V_{off}$ may be equal to $$V2 - V1 = 2R[I_{offset} + 2I_{fine}] + \Delta R[I_{offset} + 2I_{fine}]$$

After calibration, the term $[I_{offset}+2I_{fine}]$ goes to zero, thus cancelling ΔR. Measurement errors, including measurement path leakage and ADC offset, may also be cancelled out (or at least reduced) in this manner.

In some aspects, a first calibration may be performed for each HRM. For example, any mismatch between the differential outputs of a first HRM (e.g., HRM 802) may be calibrated, followed by the second HRM (e.g., HRM 804), and so on, as described in more detail with respect to FIG. 11A. Once the differential outputs of each HRM are calibrated, any mismatch between HRMs may be calibrated, as described in more detail with respect to FIG. 11B.

Figure 11A:
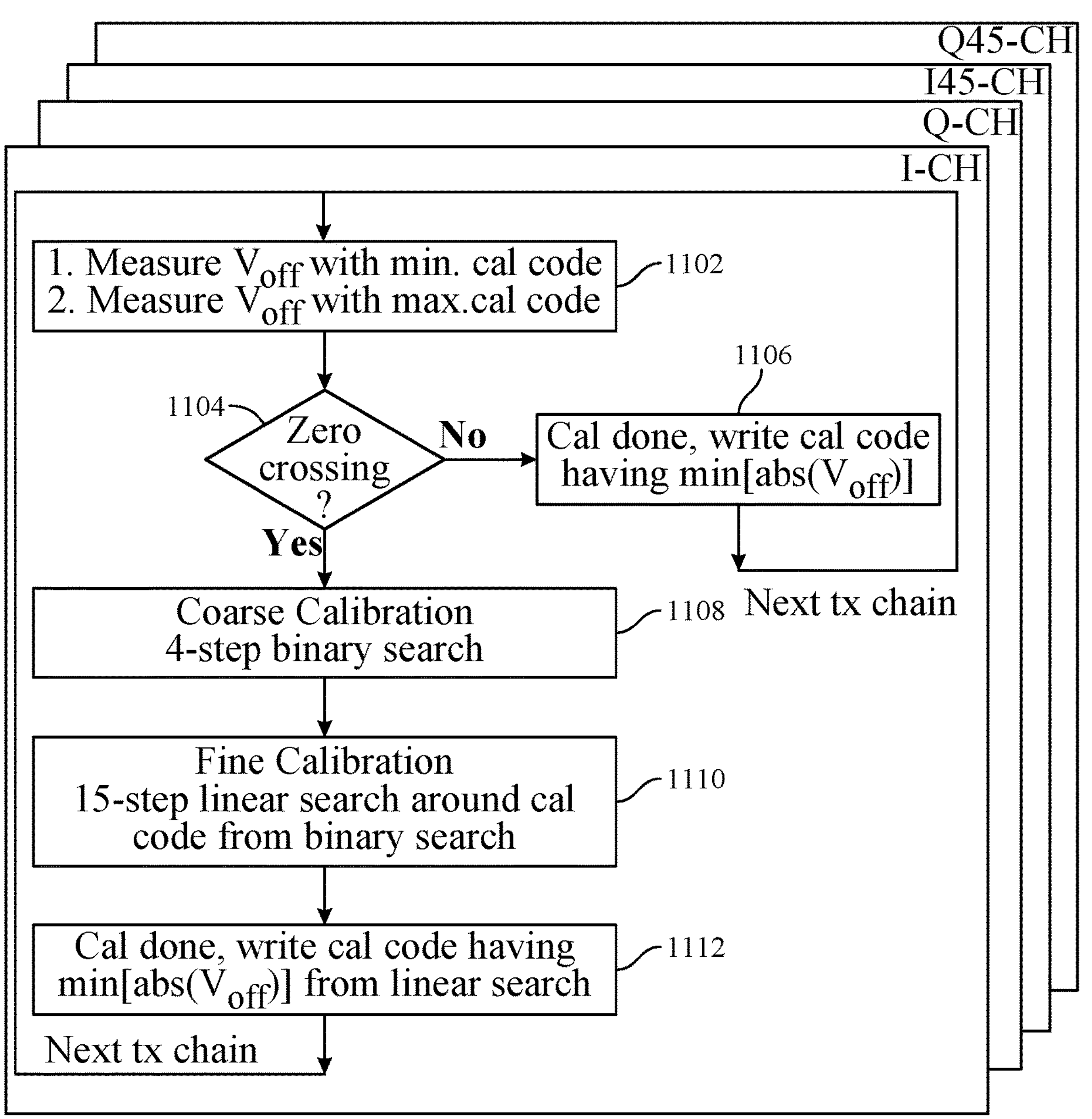
FIG. 11A is a flow diagram illustrating a calibration algorithm which may be executed via a controller, in accordance with certain aspects of the present disclosure.

FIG. 11A is a flow diagram illustrating a DC-offset calibration algorithm which may be executed via a controller, in accordance with certain aspects of the present disclosure. As shown, at block 1102, the controller may measure $V_{off}$ associated with each of a maximum and a minimum calibration code. At block 1104, the controller may determine whether the measured $V_{off}$ has a zero crossing. For example, if $V_{off}$ associated with the calibration codes does not reach zero (e.g., no calibration may be selected that would result in $V_{off}$ being zero), then the calibration code (e.g., a minimum of the absolute value of $V_{off}$, labeled "min[abs($V_{off}$)") associated with the minimum that $V_{off}$ can reach may be selected at block 1106. Then, the next TX chain (if any) may be calibrated. If $V_{off}$ can reach zero, a coarse and a fine calibration may be performed. For example, for the coarse calibration at block 1108, a binary search (e.g., a 4-step binary search) may be performed to reduce $V_{off}$. After the coarse calibration, fine calibration may be performed at block 1110 by performing a linear search (e.g., a 15-step linear search) around the calibration code derived from the binary search. The determined calibration code (e.g., min[abs($V_{off}$)]) after performing the coarse and fine calibrations may be saved at block 1112 and used for calibration during mission mode, as described. Once each of the HRMs (e.g., each of the I, Q, I45, Q45 HRMs) is calibrated, harmonic rejection calibration across HRMs may begin as described with respect to FIG. 11B.

Figure 11B:
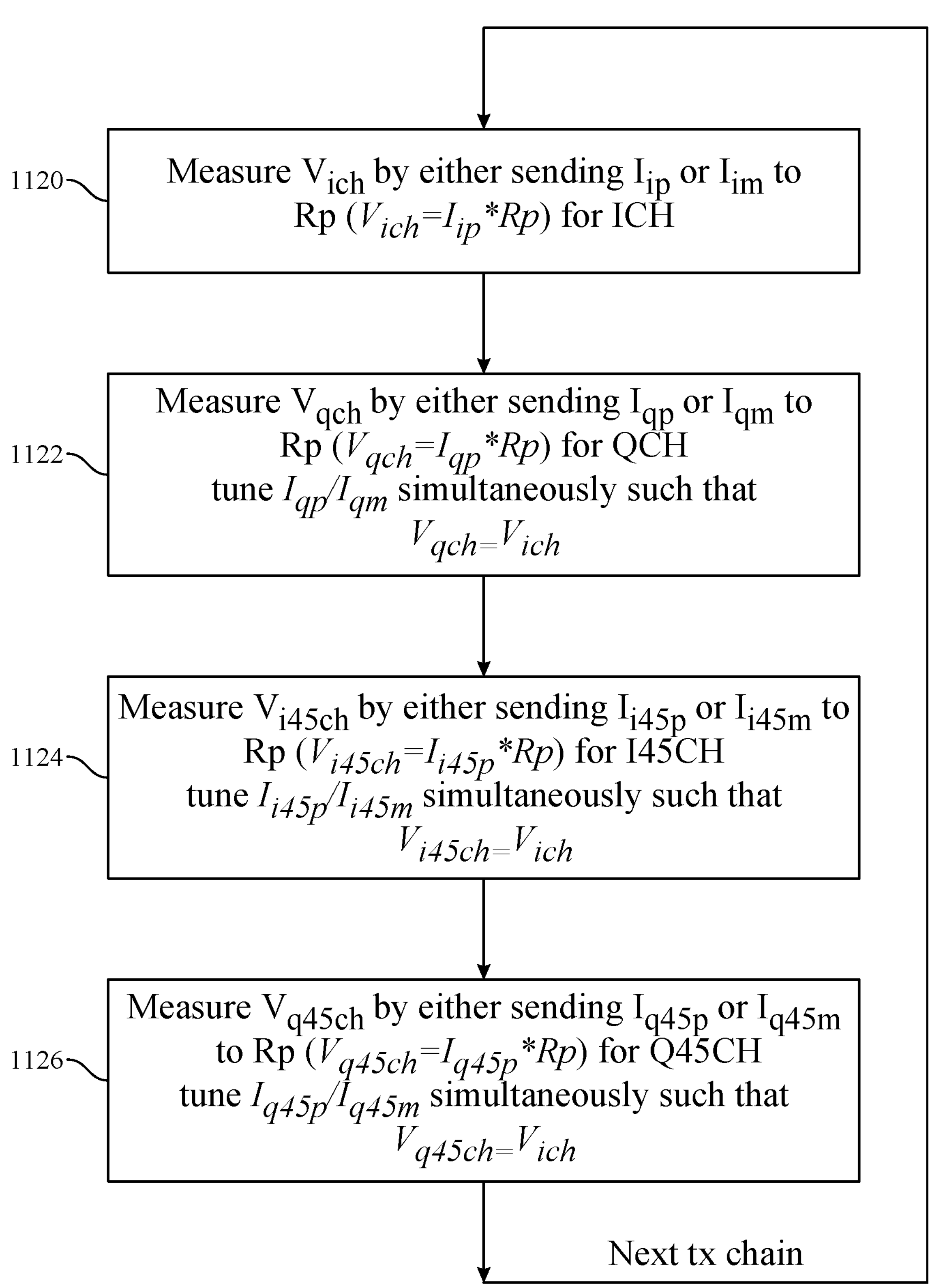
FIG. 11B is a flow diagram illustrating harmonic rejection calibration, in accordance with certain aspects of the present disclosure.

FIG. 11B is a flow diagram illustrating harmonic rejection calibration, in accordance with certain aspects of the present disclosure. As shown, at block 1120, an I-channel voltage ($V_{ich}$) may be measured via the calibration ADC 833, where $V_{ich}$ is the voltage at $R_p$. For example, the calibration switches shown in FIG. 9 may be controlled to sink the I HRM positive output current ($I_{ip}$) or I HRM negative output current ($I_{im}$) (e.g., $I_p$ or $I_m$ for the I HRM 802) from $R_p$, while measuring $V_{ich}$ at $R_P$ (e.g., where $V_{ich}=I_{ip}$ (or $I_{im}$)$\times R_p$). Similarly, at block 1122, the Q-channel voltage ($V_{qch}$) may be measured by sinking Q HRM positive output current ($I_{qp}$) or Q HRM negative output current ($I_{qm}$) (e.g., $I_p$ or $I_m$ for Q HRM 804) from $R_p$, while measuring $V_{qch}$ at $R_P$ (e.g., where $V_{qch}=I_{qp}$ (or $I_{qm}$)$\times R_p$). $I_{qp}$ and/or $I_{qm}$ may be tuned so that $V_{qch}$ is equal to $V_{ich}$. Similarly, at block 1124, an I-45 channel voltage ($V_{i45ch}$) may be measured and tuned, and a Q-45 channel voltage ($V_{q45ch}$) may be measured and tuned, as shown. For example, the $V_{i45ch}$ may be measured by sinking I45 HRM positive output current ($I_{i45p}$) or Q HRM negative output current ($I_{i45m}$) (e.g., $I_p$ or $I_m$ for I45 HRM 806) from $R_p$, while measuring $V_{i45ch}$ at $R_P$ (e.g., where $V_{i45ch}=I_{i45p}$ (or $I_{i45m}$)$\times R_p$). $I_{i45p}$ and/or $I_{i45m}$ may be tuned so that $V_{i45ch}$ is equal to $V_{qch}$. At block 1126, the $V_{q45ch}$ may be measured by sinking Q45 HRM positive output current ($I_{q45p}$) or Q HRM negative output current ($I_{q45m}$) (e.g., $I_p$ or $I_m$ for Q45 HRM 808) from Rp, while measuring $V_{q45ch}$ at $R_P$ (e.g., where $V_{q45ch}=I_{q45p}$ (or $I_{q45m}$)$\times R_p$). $I_{q45p}$ and/or $I_{q45m}$ may be tuned so that $V_{q45ch}$ is equal to $V_{i45ch}$.

The calibration technique described herein cancels (or at least reduces) errors introduced by measurement circuitry (e.g., resistors, transmission lines, and/or the ADC). The calibration for a multi-phase high-performance mixer uses only a few additional components compared to some implementations, and only a one-time calibration may be performed, in some aspects. Common circuitry may be used to correct the DC offset (e.g., LO leakage) and amplitude mismatch between BB signals (e.g., harmonic rejection calibration). LO-leakage levels of less than −62 dBc may be achieved after calibration (e.g., with DC offset and DCOC calibration).

Figure 12:
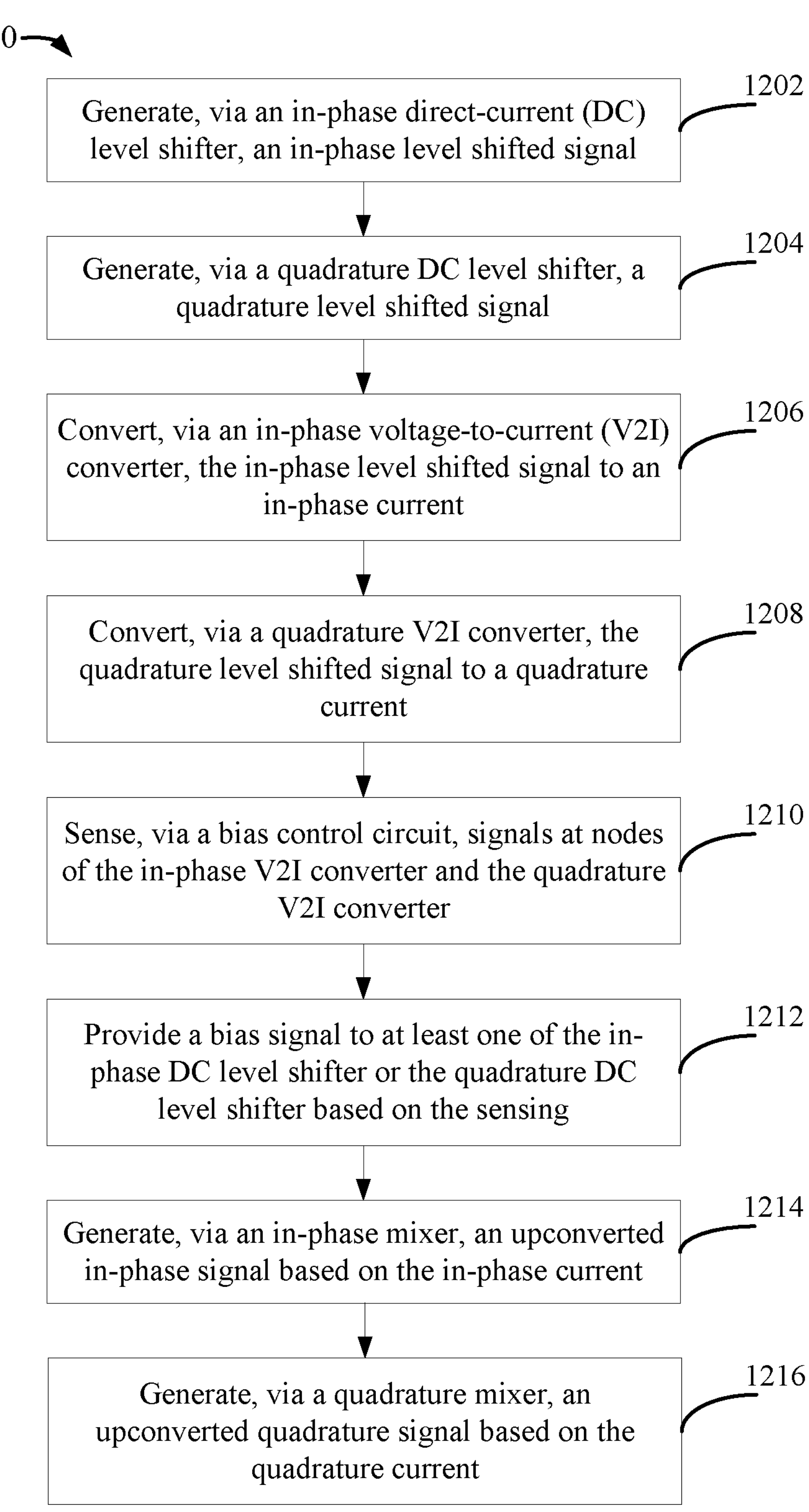
FIGS. 12 and 13 are flow diagrams illustrating example operations for wireless communication, in accordance with certain aspects of the present disclosure.

FIG. 12 is a flow diagram illustrating example operations 1200 for wireless communication. The operations 1200 may be performed by a transmitter chain, such as the transmitter chain 500.

At block 1202, the transmitter chain generates, via an in-phase DC level shifter (e.g., an I DC level shifter of level shifters 506), an in-phase level-shifted signal. At block 1204, the transmitter chain generates, via a quadrature DC level shifter (e.g., a quadrature DC level shifter of level shifter 506), a quadrature level-shifted signal.

At block 1206, the transmitter chain converts, via an in-phase V2I converter (e.g., I V2I converter of V2I converters 510), the in-phase level-shifted signal to an in-phase current. At block 1208, the transmitter chain converts, via a quadrature V2I converter (e.g., a quadrature V2I converter of V2I converters 510), the quadrature level-shifted signal to a quadrature current.

At block 1210, the transmitter chain senses, via a bias control circuit (e.g., bias control circuit 502), signals at nodes of the in-phase V2I converter and the quadrature V2I converter. At block 1212, the transmitter chain provides a bias signal to at least one of the in-phase DC level shifter or the quadrature DC level shifter based on the sensing.

At block 1214, the transmitter chain generates, via an in-phase mixer (e.g., an in-phase mixer of mixers 550, or mixer 802), an upconverted in-phase signal based on the in-phase current. At block 1216, the transmitter chain generates, via a quadrature mixer (e.g., a quadrature mixer of mixers 550, or mixer 804), an upconverted quadrature signal based on the quadrature current.

In some aspects, the in-phase DC level shifter may include a first source follower (e.g., including transistors 580, 586) configured to DC level shift an in-phase signal to generate the in-phase level-shifted signal. The quadrature DC level shifter may include a second source follower configured to DC level shift a quadrature signal to generate the quadrature level-shifted signal. In some aspects, the in-phase V2I converter may include a first tail current source, and the quadrature V2I converter may include a second tail current source. The sensed signals may include a first VDS associated with the first tail current source and a second VDS associated with the second tail current source. The bias signal may be provided to a gate of a bias transistor of at least one of the first source follower or the second source follower The at least one of the in-phase V2I converter or the quadrature V2I converter may include a tail current source (e.g., tail device 560 of FIG. 5B). The sensed signals may include a first drain-to-source voltage (VDS) (e.g., labeled "VDS-I" in FIG. 5B) associated with the first source follower and a second VDS (e.g., labeled "VDS-Q" in FIG. 5B) associated with the second source follower. The bias signal may be provided to a control input (e.g., a gate of the associated transistor) of the tail current source.

In some aspects, the transmitter chain senses, via a current-sensing circuit, a positive differential output current and a negative differential output current of at least one of the in-phase mixer or the quadrature mixer. At least one of the in-phase current or the quadrature current may be generated based on the sensed positive differential output current and the sensed negative differential output current.

In some aspects, at least one of the in-phase mixer or the quadrature mixer may include a positive differential output and a negative differential output. The transmitter chain may sense a first voltage at a first resistive element (e.g., resistive element $R_P$ of FIG. 9) while the first resistive element is coupled to the positive differential output. The transmitter chain may sense a second voltage at a second resistive element (e.g., resistive element $R_M$ of FIG. 9) while the second resistive element is coupled to the negative differential output. The transmitter chain may bias the at least one of the in-phase mixer or the quadrature mixer based on the first voltage and the second voltage. In some aspects, the transmitter chain may sense a third voltage at the first resistive element while the first resistive element is coupled to the negative differential output and sense a fourth voltage at the second resistive element while the second resistive element is coupled to the positive differential output. The transmitter chain may bias the at least one of the in-phase mixer or the quadrature mixer based on the third voltage and the fourth voltage.

In some aspects, the transmitter chain may route, via a first switch (e.g., transistor 606) of a first current path (e.g., current path 602), at least a portion of a current from the positive differential output to a first balanced terminal (e.g., terminal 692) of a first balun component (e.g. balun 690). The transmitter chain may route, via a second switch (e.g., transistor 612) of a second current path (e.g., current path 604), the at least the portion of the current from a second balanced terminal (e.g., terminal 694) of the balun component towards the negative differential output. An unbalanced terminal of the balun component may be coupled to a transmitter port (e.g., port 508). The transmitter chain may route, via a third switch (e.g., transistor 608) or a fourth switch (e.g., transistor 610), at least another portion of the current from the positive differential output to the second current path.

Figure 13:
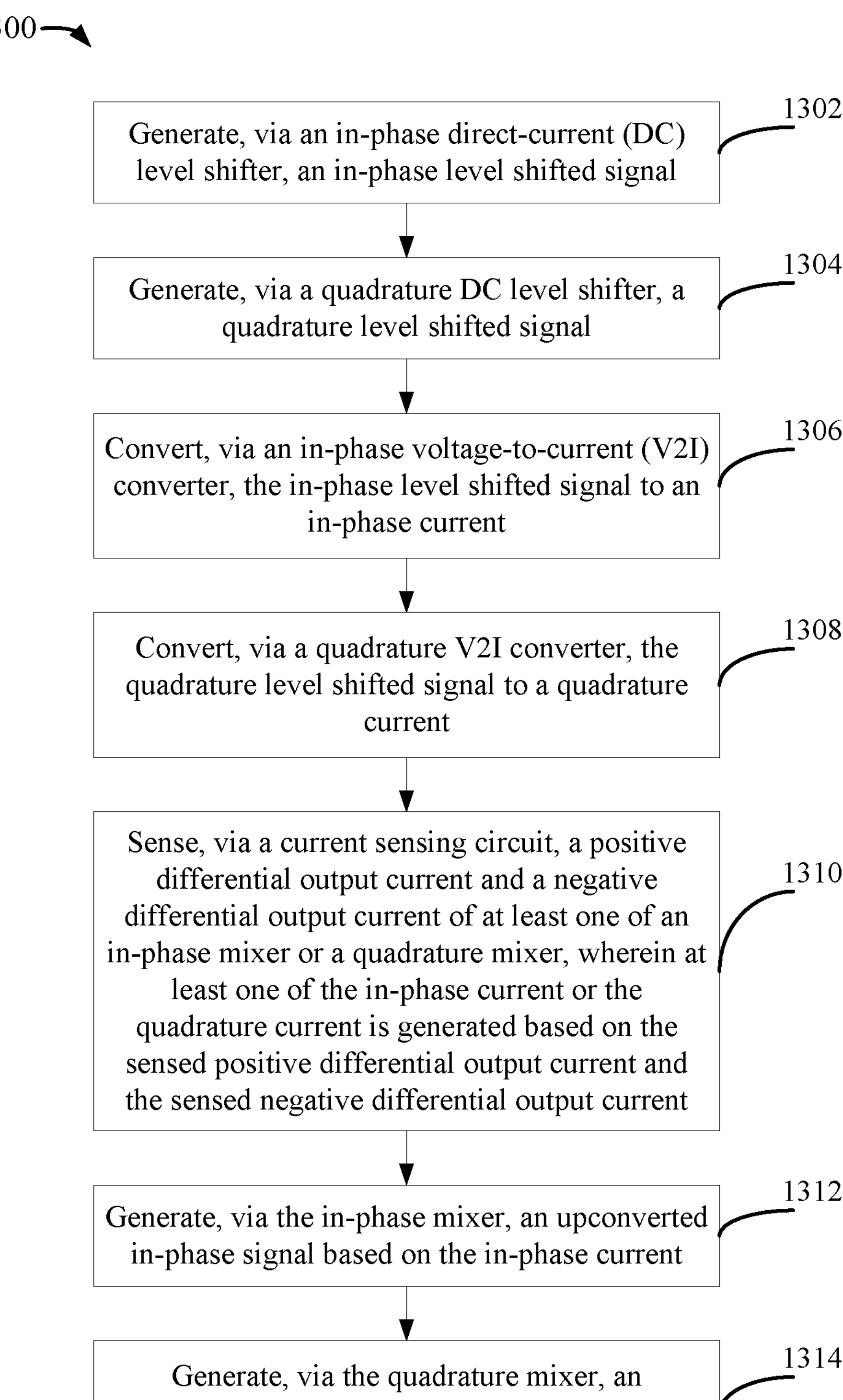

FIG. 13 is a flow diagram illustrating example operations 1300 for wireless communication. The operations 1300 may be performed, for example, by a transmitter chain, such as the transmitter chain 500.

At block 1302, the transmitter chain generates, via an in-phase DC level shifter (e.g., I DC level shifter of the level shifters 506), an in-phase level-shifted signal. At block 1304, the transmitter chain generates, via a quadrature DC level shifter (e.g., Q DC level shifter of the level shifters 506), a quadrature level-shifted signal.

At block 1306, the transmitter chain converts, via an in-phase V2I converter, the in-phase level-shifted signal to an in-phase current. At block 1308, the transmitter chain converts, via a quadrature V2I converter, the quadrature level-shifted signal to a quadrature current.

At block 1310, the transmitter chain senses, via a current-sensing circuit (e.g., current-sensing circuit 552), a positive differential output current and a negative differential output current of at least one of an in-phase mixer (e.g., HRM 802) or a quadrature mixer (e.g., HRM 804). At least one of the in-phase current or the quadrature current may be generated based on the sensed positive differential output current and the sensed negative differential output current.

At block 1312, the transmitter chain generates, via the in-phase mixer, an upconverted in-phase signal based on the in-phase current. At block 1314, the transmitter chain generates, via the quadrature mixer, an upconverted quadrature signal based on the quadrature current.

In some aspects, at least one of the in-phase mixer or the quadrature mixer may include a positive differential output and a negative differential output. The transmitter chain may sense a first voltage at a first resistive element (e.g., resistive element $R_P$ of FIG. 9) while the first resistive element is coupled to the positive differential output. The transmitter chain may sense a second voltage at a second resistive element (e.g., resistive element $R_M$ of FIG. 9) while the second resistive element is coupled to the negative differential output. The transmitter chain may bias the at least one of the in-phase mixer or the quadrature mixer based on the first voltage and the second voltage. In some aspects, the transmitter chain may sense a third voltage at the first resistive element while the first resistive element is coupled to the negative differential output and sense a fourth voltage at the second resistive element while the second resistive element is coupled to the positive differential output. The transmitter chain may bias the at least one of the in-phase mixer or the quadrature mixer based on the third voltage and the fourth voltage.

Example Aspects

Aspect 1. A transceiver, comprising: at least one mixer; a first signal path having a first balanced to unbalanced (balun) component; and a second signal path having a second balun component, wherein: the mixer is selectively coupled to the first signal path or the second signal path; and the first signal path and the second signal path are coupled to a node.

Aspect 2. The transceiver of Aspect 1, wherein the node is coupled to an input of a driver amplifier (DA).

Aspect 3. The transceiver of any of Aspects 1-2, wherein the at least one mixer comprises a harmonic rejection mixer (HRM).

Aspect 4. The transceiver of any of Aspects 1-3, wherein the at least one mixer comprises: a first differential harmonic rejection mixer (HRM) associated with an in-phase (I) signal; a second differential HRM associated with an quadrature (1) signal; a third differential HRM associated with a 45 degree offset I (I45) signal; and a fourth differential HRM associated with a 45 degree offset Q (Q45) signal.

Aspect 5. The transceiver of any of Aspects 1-4, wherein the first signal path comprises a gain control stage.

Aspect 6. The transceiver of Aspect 5, wherein the gain control stage includes: a first switch coupled between a first differential node of the first signal path and a first terminal of the first balun component; a second switch coupled between a second differential node of the first signal path and a second terminal of the first balun component; a third switch coupled between the first differential node of the first signal path and the second terminal of the first balun component; and a fourth switch coupled between the second differential node of the first signal path and the first terminal of the first balun component.

Aspect 7. The transceiver of any of Aspects 1-6, further comprising: calibration path circuitry coupled to a first differential output and a second differential output of the at least one mixer; and an analog-to-digital converter (ADC) coupled to the calibration path circuitry.

Aspect 8. The transceiver of Aspect 7, wherein the calibration path circuitry includes switches configured to selectively couple: the first differential output to a first input of the ADC; the first differential output to a second input of the ADC; the second differential output to the first input of the ADC; or the second differential output to the second input of the ADC.

Aspect 9. The transceiver of Aspect 8, wherein the calibration path circuitry further includes: a first resistive element selectively coupled to the first input of the ADC and a power supply node; and a second resistive element selectively coupled to the second input of the ADC and the power supply node.

Aspect 10: An apparatus for wireless communication, comprising: an in-phase direct-current (DC) level shifter; a quadrature DC level shifter; an in-phase voltage-to-current (V2I) converter having an input coupled to an output of the in-phase DC level shifter; a quadrature V2I converter having an input coupled to an output of the quadrature V2I converter; a bias control circuit having inputs coupled to the in-phase V2I converter and the quadrature V2I converter, an output of the bias control circuit being coupled to at least one of the in-phase DC level shifter or the quadrature DC level shifter; an in-phase mixer having an input coupled to an output of the in-phase V2I converter; and a quadrature mixer having an input coupled to an output of the quadrature V2I converter.

Aspect 11: The apparatus of Aspect 10, wherein: the in-phase DC level shifter comprises a first source follower circuit configured to DC level shift an in-phase signal; and the quadrature DC level shifter comprises a second source follower circuit configured to DC level shift a quadrature signal.

Aspect 12: The apparatus of Aspect 11, wherein: the in-phase V2I converter comprises a first tail current source; the quadrature V2I converter comprises a second tail current source; and the bias control circuit is configured to: sense a first drain-to-source voltage (VDS) associated with the first tail current source and a second VDS associated with the second tail current source; and bias at least one of the first source follower circuit or the second source follower circuit based on the first VDS and the second VDS.

Aspect 13: The apparatus of Aspect 12, wherein the bias control circuit comprises an amplifier having a first input configured to receive an average of the first VDS and the second VDS, a second input configured to receive a reference voltage, and an output coupled to a gate of a bias transistor of at least one of the first source follower circuit or the second source follower circuit.

Aspect 14: The apparatus according to any of Aspects 11-13, further comprising a phase interpolator comprising: A first output coupled to an input of the first source follower circuit and configured to generate the in-phase signal; and a second output coupled to an input of the second source follower circuit and configured to generate the quadrature signal.

Aspect 15: The apparatus according to any of Aspects 10-14, further comprising: a current-sensing circuit having inputs coupled to a positive differential output and a negative differential output of at least one of the in-phase mixer or the quadrature mixer; and a digital-to-analog converter (DAC) having an input coupled to the current-sensing circuit and an output coupled to the at least one of the in-phase V2I converter or the quadrature V2I converter.

Aspect 16: The apparatus according to Aspect 15, wherein the current-sensing circuit comprises: a first resistive element selectively coupled to the positive differential output or the negative differential output and a second resistive element selectively coupled to the positive differential output or the negative differential output; and an analog-to-digital converter (ADC) having a first input selectively coupled to the first resistive element and a second input selectively coupled to the second resistive element.

Aspect 17: The apparatus according to Aspect 16, wherein: the ADC is configured to: sense a first voltage at the first resistive element while the first resistive element is coupled to the positive differential output; and sense a second voltage at the second resistive element while the second resistive element is coupled to the negative differential output; and the DAC is configured to bias the at least one of the in-phase mixer or the quadrature mixer based on the first voltage and the second voltage using at least one of the I V2I converter or the Q V2I converter.

Aspect 18: The apparatus according to Aspect 17, wherein: the ADC is configured to: sense a third voltage at the first resistive element while the first resistive element is coupled to the negative differential output; and sense a fourth voltage at the second resistive element while the second resistive element is coupled to the positive differential output; and the DAC is configured to bias the at least one of the in-phase mixer or the quadrature mixer based on the third voltage and the fourth voltage using at least one of the I V2I converter or the Q V2I converter.

Aspect 19: The apparatus according to any of Aspects 10-18, wherein the in-phase mixer and the quadrature mixer comprise harmonic rejection mixers.

Aspect 20: The apparatus of Aspect 10, further comprising: a first signal path coupled to a differential output pair of at least one of the in-phase mixer or the quadrature mixer; and a second signal path coupled to the differential output pair of at least one of the in-phase mixer or the quadrature mixer, wherein the first signal path and the second signal path are further coupled to a transmitter port of the apparatus.

Aspect 21: The apparatus according to Aspect 20, wherein the first signal path comprises: a first balanced-unbalanced (balun) component having an unbalanced terminal coupled to the transmitter port; a first switch coupled between a first differential output of the differential output pair and a first balanced terminal of the first balun component; and a second switch coupled between a second differential output of the differential output pair and a second balanced terminal of the first balun component.

Aspect 22: The apparatus according to Aspect 21, wherein the second signal path comprises: a second balun component having an unbalanced terminal coupled to the transmitter port; a third switch coupled between the first differential output of the differential output pair and a first balanced terminal of the second balun component; and a fourth switch coupled between the second differential output of the differential output pair and a second balanced terminal of the second balun component.

Aspect 23: The apparatus according to any of Aspects 21-22, wherein the first signal path further comprises: a third switch coupled between the first differential output and the second balanced terminal; and a fourth switch coupled between the second differential output and the first balanced terminal.

Aspect 24: The apparatus according to any of Aspects 10-23, further comprising a transceiver including the I mixer and the Q mixer.

Aspect 25: The apparatus according to Aspect 24, wherein the transceiver is part of a base station.

Aspect 26: A method for wireless communication, comprising: generating, via an in-phase direct-current (DC) level shifter, an in-phase level-shifted signal; generating, via a quadrature DC level shifter, a quadrature level-shifted signal; converting, via an in-phase voltage-to-current (V2I) converter, the in-phase level-shifted signal to an in-phase current; converting, via a quadrature V2I converter, the quadrature level-shifted signal to a quadrature current; sensing, via a bias control circuit, signals at nodes of the in-phase V2I converter and the quadrature V2I converter; providing a bias signal to at least one of the in-phase DC level shifter or the quadrature DC level shifter based on the sensing; generating, via an in-phase mixer, an upconverted in-phase signal based on the in-phase current; and generating, via a quadrature mixer, an upconverted quadrature signal based on the quadrature current.

Aspect 27: The method according to Aspect 26, wherein: the in-phase DC level shifter comprises a first source follower; generating the in-phase level-shifted signal comprises level shifting an in-phase signal using the first source follower to generate the in-phase level-shifted signal; the quadrature DC level shifter comprises a second source follower; and generating the quadrature level-shifted signal comprises level shifting a quadrature signal using the second source follower to generate the quadrature level-shifted signal.

Aspect 28: The method according to Aspect 27, wherein: the in-phase V2I converter comprises a first tail current source; the quadrature V2I converter comprises a second tail current source; and the sensed signals comprise a first drain-to-source voltage (VDS) associated with the first tail current source and a second VDS associated with the second tail current source; and the bias signal is provided to a gate of a bias transistor of at least one of the first source follower or the second source follower.

Aspect 29: The method according to any of Aspects 26-28, further comprising sensing, via a current-sensing circuit, a positive differential output current and a negative differential output current of at least one of the in-phase mixer or the quadrature mixer, wherein at least one of the in-phase current or the quadrature current is generated based on the sensed positive differential output current and the sensed negative differential output current.

Aspect 30: The method according to any of Aspects 26-29, wherein at least one of the in-phase mixer or the quadrature mixer comprises a positive differential output and a negative differential output, the method further comprising: sensing a first voltage at a first resistive element while the first resistive element is coupled to the positive differential output; sensing a second voltage at a second resistive element while the second resistive element is coupled to the negative differential output; and biasing the at least one of the in-phase mixer or the quadrature mixer based on the first voltage and the second voltage.

Aspect 31: The method according Aspect 30, further comprising: sensing a third voltage at the first resistive element while the first resistive element is coupled to the negative differential output; sensing a fourth voltage at the second resistive element while the second resistive element is coupled to the positive differential output; and biasing the at least one of the in-phase mixer or the quadrature mixer based on the third voltage and the fourth voltage.

Aspect 32: The method according to any of Aspects 26-31, wherein the in-phase mixer and the quadrature mixer comprise harmonic rejection mixers.

Aspect 33: The method according to any of Aspects 26-32, wherein one of the in-phase mixer or the quadrature mixer comprises a positive differential output and a negative differential output, the method further comprising: routing, via a first switch of a first current path, at least a portion of a current from the positive differential output to a first balanced terminal of a first balanced-unbalanced (balun) component; and routing, via a second switch of a second current path, the at least the portion of the current from a second balanced terminal of the balun component towards the negative differential output, wherein an unbalanced terminal of the balun component is coupled to a transmitter port.

Aspect 34: The method according to Aspect 33, further comprising routing, via a third switch, at least another portion of the current from the positive differential output to the second current path.

Aspect 35: An apparatus for wireless communication, comprising: an in-phase direct-current (DC) level shifter; a quadrature DC level shifter; an in-phase voltage-to-current (V2I) converter having an input coupled to an output of the in-phase DC level shifter; a quadrature V2I converter having an input coupled to an output of the quadrature V2I converter; an in-phase mixer having an input coupled to an output of the in-phase V2I converter; a quadrature mixer having an input coupled to an output of the quadrature V2I converter; a current-sensing circuit having inputs coupled to a positive differential output and a negative differential output of at least one of the in-phase mixer or the quadrature mixer; and a digital-to-analog converter (DAC) having an input coupled to the current-sensing circuit and an output coupled to the at least one of the in-phase V2I converter or the quadrature V2I converter.

Aspect 36: The apparatus according Aspect 35, wherein the current-sensing circuit comprises: a first resistive element selectively coupled to the positive differential output or the negative differential output and a second resistive element selectively coupled to the positive differential output or the negative differential output; and an analog-to-digital converter (ADC) having a first input selectively coupled to the first resistive element and a second input selectively coupled to the second resistive element.

Aspect 37: The apparatus according to Aspect 36, wherein: the ADC is configured to: sense a first voltage at the first resistive element while the first resistive element is coupled to the positive differential output; and sense a second voltage at the second resistive element while the second resistive element is coupled to the negative differential output; and the DAC is configured to bias the at least one of the in-phase mixer or the quadrature mixer based on the first voltage and the second voltage using at least one of the I V2I converter or the Q V2I converter.

Aspect 38: The apparatus according to Aspect 37, wherein: the ADC is configured to: sense a third voltage at the first resistive element while the first resistive element is coupled to the negative differential output; and sense a fourth voltage at the second resistive element while the second resistive element is coupled to the positive differential output; and the DAC is configured to bias the at least one of the in-phase mixer or the quadrature mixer based on the third voltage and the fourth voltage using at least one of the I V2I converter or the Q V2I converter.

Aspect 39: A method for wireless communication, comprising: generating, via an in-phase direct-current (DC) level shifter, an in-phase level-shifted signal; generating, via a quadrature DC level shifter, a quadrature level-shifted signal; converting, via an in-phase voltage-to-current (V2I) converter, the in-phase level-shifted signal to an in-phase current; converting, via a quadrature V2I converter, the quadrature level-shifted signal to a quadrature current; sensing, via a current-sensing circuit, a positive differential output current and a negative differential output current of at least one of an in-phase mixer or a quadrature mixer, wherein at least one of the in-phase current or the quadrature current is generated based on the sensed positive differential output current and the sensed negative differential output current; generating, via the in-phase mixer, an upconverted in-phase signal based on the in-phase current; and generating, via the quadrature mixer, an upconverted quadrature signal based on the quadrature current.

Within the present disclosure, the word “exemplary” is used to mean “serving as an example, instance, or illustration.” Any implementation or aspect described herein as “exemplary” is not necessarily to be construed as preferred or advantageous over other aspects of the disclosure. Likewise, the term “aspects” does not require that all aspects of the disclosure include the discussed feature, advantage, or mode of operation. The term “coupled” is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms “circuit” and “circuitry” are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as “elements”). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An apparatus for wireless communication, comprising:
- an in-phase direct-current (DC) level shifter;
- a quadrature DC level shifter;
- an in-phase voltage-to-current (V2I) converter having an input coupled to an output of the in-phase DC level shifter;
- a quadrature V2I converter having an input coupled to an output of the quadrature V2I converter;
- a bias control circuit having inputs coupled to the in-phase V2I converter and the quadrature V2I converter, an output of the bias control circuit being coupled to at least one of the in-phase DC level shifter or the quadrature DC level shifter;
- an in-phase mixer having an input coupled to an output of the in-phase V2I converter; and
- a quadrature mixer having an input coupled to an output of the quadrature V2I converter.

2. The apparatus of claim 1, wherein:
- the in-phase DC level shifter comprises a first source follower circuit configured to DC level shift an in-phase signal; and
- the quadrature DC level shifter comprises a second source follower circuit configured to DC level shift a quadrature signal.

3. The apparatus of claim 2, wherein:
- the in-phase V2I converter comprises a first tail current source;
- the quadrature V2I converter comprises a second tail current source; and
- the bias control circuit is configured to:
  - sense a first drain-to-source voltage (VDS) associated with the first tail current source and a second VDS associated with the second tail current source; and
  - bias at least one of the first source follower circuit or the second source follower circuit based on the first VDS and the second VDS.

4. The apparatus of claim 3, wherein the bias control circuit comprises an amplifier having a first input configured to receive an average of the first VDS and the second VDS, a second input configured to receive a reference voltage, and an output coupled to a gate of a bias transistor of at least one of the first source follower circuit or the second source follower circuit.

5. The apparatus of claim 2, further comprising a phase interpolator comprising:
- a first output coupled to an input of the first source follower circuit and configured to generate the in-phase signal; and
- a second output coupled to an input of the second source follower circuit and configured to generate the quadrature signal.

6. The apparatus of claim 1, further comprising:
- a current-sensing circuit having inputs coupled to a positive differential output and a negative differential output of at least one of the in-phase mixer or the quadrature mixer; and
- a digital-to-analog converter (DAC) having an input coupled to the current-sensing circuit and an output coupled to the at least one of the in-phase V2I converter or the quadrature V2I converter.

7. The apparatus of claim 6, wherein the current-sensing circuit comprises:
- a first resistive element selectively coupled to the positive differential output or the negative differential output and a second resistive element selectively coupled to the positive differential output or the negative differential output; and
- an analog-to-digital converter (ADC) having a first input selectively coupled to the first resistive element and a second input selectively coupled to the second resistive element.

8. The apparatus of claim 7, wherein:
- the ADC is configured to:
  - sense a first voltage at the first resistive element while the first resistive element is coupled to the positive differential output; and
  - sense a second voltage at the second resistive element while the second resistive element is coupled to the negative differential output; and
- the DAC is configured to bias the at least one of the in-phase mixer or the quadrature mixer based on the first voltage and the second voltage using at least one of the in-phase V2I converter or the quadrature V2I converter.

9. The apparatus of claim 8, wherein:

the ADC is configured to:

sense a third voltage at the first resistive element while the first resistive element is coupled to the negative differential output; and sense a fourth voltage at the second resistive element while the second resistive element is coupled to the positive differential output; and the DAC is configured to bias the at least one of the in-phase mixer or the quadrature mixer based on the third voltage and the fourth voltage using at least one of the in-phase V2I converter or the quadrature V2I converter.

10. The apparatus of claim 1, wherein the in-phase mixer and the quadrature mixer comprise harmonic rejection mixers.

11. The apparatus of claim 1, further comprising:

a first signal path coupled to a differential output pair of at least one of the in-phase mixer or the quadrature mixer; and a second signal path coupled to the differential output pair of at least one of the in-phase mixer or the quadrature mixer, wherein the first signal path and the second signal path are further coupled to a transmitter port of the apparatus.

12. The apparatus of claim 11, wherein the first signal path comprises:

a first balanced-unbalanced (balun) component having an unbalanced terminal coupled to the transmitter port;

a first switch coupled between a first differential output of the differential output pair and a first balanced terminal of the first balun component; and a second switch coupled between a second differential output of the differential output pair and a second balanced terminal of the first balun component.

13. The apparatus of claim 12, wherein the second signal path comprises:

a second balun component having an unbalanced terminal coupled to the transmitter port;

a third switch coupled between the first differential output of the differential output pair and a first balanced terminal of the second balun component; and a fourth switch coupled between the second differential output of the differential output pair and a second balanced terminal of the second balun component.

14. The apparatus of claim 12, wherein the first signal path further comprises:

a third switch coupled between the first differential output and the second balanced terminal; and a fourth switch coupled between the second differential output and the first balanced terminal.

15. The apparatus of claim 1, further comprising a transceiver including the in-phase mixer and the quadrature mixer.

16. The apparatus of claim 15, wherein the transceiver is part of a base station.

17. A method for wireless communication, comprising:

generating, via an in-phase direct-current (DC) level shifter, an in-phase level-shifted signal;

generating, via a quadrature DC level shifter, a quadrature level-shifted signal;

converting, via an in-phase voltage-to-current (V2I) converter, the in-phase level-shifted signal to an in-phase current;

converting, via a quadrature V2I converter, the quadrature level-shifted signal to a quadrature current;

sensing, via a bias control circuit, signals at nodes of the in-phase V2I converter and the quadrature V2I converter;

providing a bias signal to at least one of the in-phase DC level shifter or the quadrature DC level shifter based on the sensing;

generating, via an in-phase mixer, an upconverted in-phase signal based on the in-phase current; and generating, via a quadrature mixer, an upconverted quadrature signal based on the quadrature current.

18. The method of claim 17, wherein:

the in-phase DC level shifter comprises a first source follower;

generating the in-phase level-shifted signal comprises level shifting an in-phase signal using the first source follower to generate the in-phase level-shifted signal;

the quadrature DC level shifter comprises a second source follower; and generating the quadrature level-shifted signal comprises level shifting a quadrature signal using the second source follower to generate the quadrature level-shifted signal.

19. The method of claim 18, wherein:

the in-phase V2I converter comprises a first tail current source;

the quadrature V2I converter comprises a second tail current source; and the sensed signals comprise a first drain-to-source voltage (VDS) associated with the first tail current source and a second VDS associated with the second tail current source; and the bias signal is provided to a gate of a bias transistor of at least one of the first source follower or the second source follower.

20. The method of claim 17, further comprising sensing, via a current-sensing circuit, a positive differential output current and a negative differential output current of at least one of the in-phase mixer or the quadrature mixer, wherein at least one of the in-phase current or the quadrature current is generated based on the sensed positive differential output current and the sensed negative differential output current.

21. The method of claim 17, wherein at least one of the in-phase mixer or the quadrature mixer comprises a positive differential output and a negative differential output, the method further comprising:

sensing a first voltage at a first resistive element while the first resistive element is coupled to the positive differential output;

sensing a second voltage at a second resistive element while the second resistive element is coupled to the negative differential output; and biasing the at least one of the in-phase mixer or the quadrature mixer based on the first voltage and the second voltage.

22. The method of claim 21, further comprising:

sensing a third voltage at the first resistive element while the first resistive element is coupled to the negative differential output;

sensing a fourth voltage at the second resistive element while the second resistive element is coupled to the positive differential output; and biasing the at least one of the in-phase mixer or the quadrature mixer based on the third voltage and the fourth voltage.

23. The method of claim 17, wherein the in-phase mixer and the quadrature mixer comprise harmonic rejection mixers.

24. The method of claim 17, wherein one of the in-phase mixer or the quadrature mixer comprises a positive differential output and a negative differential output, the method further comprising:

routing, via a first switch of a first current path, at least a portion of a current from the positive differential output to a first balanced terminal of a first balanced-unbalanced (balun) component; and routing, via a second switch of a second current path, the at least the portion of the current from a second balanced terminal of the balun component towards the negative differential output, wherein an unbalanced terminal of the balun component is coupled to a transmitter port.

25. The method of claim 24, further comprising routing, via a third switch, at least another portion of the current from the positive differential output to the second current path.

26. An apparatus for wireless communication, comprising:

an in-phase direct-current (DC) level shifter;

a quadrature DC level shifter;

an in-phase voltage-to-current (V2I) converter having an input coupled to an output of the in-phase DC level shifter;

a quadrature V2I converter having an input coupled to an output of the quadrature V2I converter;

an in-phase mixer having an input coupled to an output of the in-phase V2I converter;

a quadrature mixer having an input coupled to an output of the quadrature V2I converter;

a current-sensing circuit having inputs coupled to a positive differential output and a negative differential output of at least one of the in-phase mixer or the quadrature mixer; and a digital-to-analog converter (DAC) having an input coupled to the current-sensing circuit and an output coupled to the at least one of the in-phase V2I converter or the quadrature V2I converter.

27. The apparatus of claim 26, wherein the current-sensing circuit comprises:

a first resistive element selectively coupled to the positive differential output or the negative differential output and a second resistive element selectively coupled to the positive differential output or the negative differential output; and an analog-to-digital converter (ADC) having a first input selectively coupled to the first resistive element and a second input selectively coupled to the second resistive element.

28. The apparatus of claim 27, wherein:

the ADC is configured to:

sense a first voltage at the first resistive element while the first resistive element is coupled to the positive differential output; and sense a second voltage at the second resistive element while the second resistive element is coupled to the negative differential output; and the DAC is configured to bias the at least one of the in-phase mixer or the quadrature mixer based on the first voltage and the second voltage using at least one of the in-phase V2I converter or the quadrature V2I converter.

29. The apparatus of claim 28, wherein:

the ADC is configured to:

sense a third voltage at the first resistive element while the first resistive element is coupled to the negative differential output; and sense a fourth voltage at the second resistive element while the second resistive element is coupled to the positive differential output; and the DAC is configured to bias the at least one of the in-phase mixer or the quadrature mixer based on the third voltage and the fourth voltage using at least one of the in-phase V2I converter or the quadrature V2I converter.

30. A method for wireless communication, comprising:

generating, via an in-phase direct-current (DC) level shifter, an in-phase level-shifted signal;

generating, via a quadrature DC level shifter, a quadrature level-shifted signal;

converting, via an in-phase voltage-to-current (V2I) converter, the in-phase level-shifted signal to an in-phase current;

converting, via a quadrature V2I converter, the quadrature level-shifted signal to a quadrature current;

sensing, via a current-sensing circuit, a positive differential output current and a negative differential output current of at least one of an in-phase mixer or a quadrature mixer, wherein at least one of the in-phase current or the quadrature current is generated based on the sensed positive differential output current and the sensed negative differential output current;

generating, via the in-phase mixer, an upconverted in-phase signal based on the in-phase current; and generating, via the quadrature mixer, an upconverted quadrature signal based on the quadrature current.

* * * * *